(12) United States Patent
Lee et al.

(10) Patent No.: US 12,550,491 B2
(45) Date of Patent: Feb. 10, 2026

(54) DISPLAY DEVICE, METHOD OF MANUFACTURING THE SAME AND TILED DISPLAY DEVICE INCLUDING THE SAME

(71) Applicant: Samsung Display Co., LTD., Yongin-si (KR)

(72) Inventors: Dong Sung Lee, Suwon-si (KR); Yong Hoon Kwon, Suwon-si (KR); Mi Sun Kim, Hwaseong-si (KR); Byung Hoon Kim, Hwaseong-si (KR); Tae Oh Kim, Suwon-si (KR); Se Hun Choi, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 566 days.

(21) Appl. No.: 17/986,086

(22) Filed: Nov. 14, 2022

(65) Prior Publication Data

US 2023/0275188 A1   Aug. 31, 2023

(30) Foreign Application Priority Data

Feb. 25, 2022   (KR) .......................... 10-2022-0025164

(51) Int. Cl.
| | | |
|---|---|---|
| *H10H 20/831* | (2025.01) | |
| *G09F 9/302* | (2006.01) | |
| *G09F 9/33* | (2006.01) | |
| *H10H 20/01* | (2025.01) | |
| *H10H 20/851* | (2025.01) | |
| *H10H 20/857* | (2025.01) | |

(52) U.S. Cl.
CPC ....... *H10H 20/8312* (2025.01); *G09F 9/3026* (2013.01); *G09F 9/33* (2013.01); *H10H 20/01* (2025.01); *H10H 20/8514* (2025.01); *H10H 20/857* (2025.01); *H10H 20/032* (2025.01); *H10H 20/0364* (2025.01)

(58) Field of Classification Search
None
See application file for complete search history.

(56) References Cited

U.S. PATENT DOCUMENTS

| | | | |
|---|---|---|---|
| 2021/0034199 A1* | 2/2021 | Lee | .......................... C23C 28/00 |
| 2022/0052079 A1* | 2/2022 | Jang | ..................... H10H 29/142 |

FOREIGN PATENT DOCUMENTS

| | | |
|---|---|---|
| JP | 2017-161887 | 9/2017 |
| KR | 20150074453 A | 7/2015 |
| KR | 10-2139974 | 7/2020 |

* cited by examiner

*Primary Examiner* — Antonio B Crite
*Assistant Examiner* — Nkechinyere Esiaba
(74) *Attorney, Agent, or Firm* — Womble Bond Dickinson (US) LLP

(57) ABSTRACT

A display device, a method of manufacturing the same and a tiled display device including the same are provided. The display device includes a first substrate including a first contact hole, a first barrier insulating layer disposed on the first substrate and including a second contact hole overlapping the first contact hole in a thickness direction, a capping layer disposed on the first barrier insulating layer, at least a portion of the capping layer being disposed in the second contact hole and the first contact hole, a pad electrode disposed on the capping layer, a display layer disposed on the pad electrode, and a flexible film disposed under the first substrate and electrically connected to the pad electrode through the first contact hole and the second contact hole.

13 Claims, 16 Drawing Sheets

DISPLAY DEVICE, METHOD OF MANUFACTURING THE SAME AND TILED DISPLAY DEVICE INCLUDING THE SAME

CROSS-REFERENCE TO RELATED APPLICATION

This application claims priority to and benefit of Korean Patent Application No. 10-2022-0025164 under 35 U.S.C. 119, filed on Feb. 25, 2022, in the Korean Intellectual Property Office (KIPO), the contents of which is incorporated by reference herein in its entirety.

BACKGROUND

1. Technical Field

The disclosure relates to a display device, a tiled display device including the same, and a method of manufacturing the same.

2. Description of the Related Art

With the advance of information-oriented society, more and more demands are placed on display devices for displaying images in various ways. For example, display devices are employed in various electronic devices such as smartphones, digital cameras, laptop computers, navigation devices, and smart televisions. The display device may be a flat panel display device such as a liquid crystal display device, a field emission display device and an organic light emitting display device. Among the flat panel display devices, in the light emitting display device, since each of pixels of a display panel includes a light emitting element capable of emitting light by itself, an image can be displayed without a backlight unit providing light to the display panel.

When the display device is manufactured in a large size, a defect rate of the light emitting element may increase due to an increase in the number of pixels, thereby deteriorating productivity or reliability of the display device. To solve this problem, in a tiled display device, a large-sized screen may be implemented by connecting a plurality of display devices having a relatively small size. The tiled display device may include a boundary portion called a seam between the plurality of display devices, due to a non-display area or a bezel area of each of the plurality of display devices adjacent to each other. When a single image is displayed on the entire screen, the boundary portion between the plurality of display devices gives a sense of disconnection over the entire screen, thereby reducing a sense of immersion in the image.

SUMMARY

Aspects of the disclosure provide a display device capable of reducing contact resistance and protecting a pad electrode from external environment by forming a capping layer that covers the pad electrode, a method of manufacturing the same, and a tiled display device including the same.

However, aspects of the disclosure are not restricted to those set forth herein. The above and other aspects of the disclosure will become more apparent to one of ordinary skill in the art to which the disclosure pertains by referencing the detailed description of the disclosure given below.

According to an embodiment of the disclosure, a display device may include a first substrate comprising a first contact hole, a first barrier insulating layer disposed on the first substrate and comprising a second contact hole overlapping the first contact hole in a thickness direction, a capping layer disposed on the first barrier insulating layer, at least a portion of the capping layer being disposed in the second contact hole and the first contact hole, a pad electrode disposed on the capping layer, a display layer disposed on the pad electrode, and a flexible film disposed under the first substrate and electrically connected to the pad electrode through the first contact hole and the second contact hole.

In an embodiment, the first contact hole may be a through hole penetrating the first substrate, and the second contact hole may be a through hole penetrating the first barrier insulating layer.

In an embodiment, the capping layer may be exposed to the outside through the first contact hole, and the capping layer may surround the pad electrode.

In an embodiment, a bottom surface of the capping layer may be disposed lower than a top surface of the first substrate.

In an embodiment, the capping layer may include at least one of ITO, IZO, and IGZO.

In an embodiment, the pad electrode may include a first metal layer disposed on the capping layer, and a second metal layer disposed on the first metal layer.

In an embodiment, a top surface of the first metal layer may be disposed lower than a top surface of the first substrate.

In an embodiment, a bottom surface of the second metal layer may be disposed lower than a top surface of the first substrate, and a top surface of the second metal layer may be disposed higher than the top surface of the first substrate.

In an embodiment, the capping layer may include a groove formed by a step between a portion disposed on the first barrier insulating layer and a portion disposed in the first contact hole and the second contact hole, and the pad electrode may be disposed in the groove.

In an embodiment, the display device may further include a second substrate, and a second barrier insulating layer disposed between the pad electrode and the display layer. The second barrier insulating layer may cover the pad electrode and the capping layer, and the second substrate may be disposed on the second barrier insulating layer.

In an embodiment, the display device may further include a connection film disposed between the flexible film and the pad electrode. The connection film may electrically connect the pad electrode to the flexible film.

In an embodiment, the flexible film may include a film pad disposed on a surface facing the first substrate, and the connection film may electrically contact each of the film pad and the capping layer.

In an embodiment, the display layer may include a thin film transistor layer disposed on the pad electrode, a light-emitting element layer disposed on the thin film transistor layer, a wavelength conversion layer disposed on the light-emitting element layer, and a color filter layer disposed on the wavelength conversion layer.

According to an embodiment of the disclosure, a method of manufacturing a display device may include preparing a first substrate, forming a first barrier insulating layer on a surface of the first substrate, forming a first contact hole on the first barrier insulating layer, forming a capping layer on the first barrier insulating layer and in the first contact hole, forming a pad electrode on the capping layer, forming a display layer on the pad electrode, forming a second contact hole on another surface of the first substrate, the second contact hole overlapping the first contact hole in a thickness direction, and electrically connecting a flexible film to the capping layer.

In an embodiment, the first contact hole may be formed by etching the first barrier insulating layer to penetrate the first barrier insulating layer and over-etching a portion of a top surface of the first substrate.

In an embodiment, the capping layer may extend from a top surface of the first barrier insulating layer to an inside of the first contact hole.

In an embodiment, the capping layer may form a groove formed by a step between a portion disposed on the first barrier insulating layer and a portion disposed in the first contact hole and the second contact hole.

In an embodiment, the pad electrode may include a first metal layer disposed on the capping layer, and a second metal layer disposed on the first metal layer. The forming of the pad electrode may include sequentially stacking and collectively etching a first metal layer material and a second metal layer material. A top surface of the first metal layer may be formed lower than a top surface of the first substrate, and a bottom surface of the second metal layer may be formed lower than the top surface of the first substrate.

In an embodiment, the second contact hole may be formed by etching the first substrate using $NF_3$ gas.

According to an embodiment of the disclosure, a tiled display device may include a plurality of display devices, and a bonding member connecting the plurality of display devices. Each of the plurality of display devices may include a display area including a plurality of pixels, a non-display area disposed adjacent to the display area, a first substrate including a first contact hole, a first barrier insulating layer disposed on the first substrate and comprising a second contact hole overlapping the first contact hole in a thickness direction, a capping layer disposed on the first barrier insulating layer, at least a portion of the capping layer being disposed in the second contact hole and the first contact hole, a pad electrode disposed on the capping layer, a display layer disposed on the pad electrode, and a flexible film disposed under the first substrate and electrically connected to the pad electrode through the first contact hole and the second contact hole.

In accordance with the display device, the method of manufacturing the same, and the tiled display device including the same, it is possible to prevent damage of a pad electrode and reduce contact resistance between the pad electrode and a flexible film when etching a first substrate.

In accordance with the display device, the method of manufacturing the same, and the tiled display device including the same, it is possible to protect the pad electrode from external environment during process by forming a capping layer that covers the pad electrode.

However, the effects of the disclosure are not limited to the aforementioned effects, and various other effects are included in the specification.

DETAILED DESCRIPTION OF THE EMBODIMENTS

Figure 1:
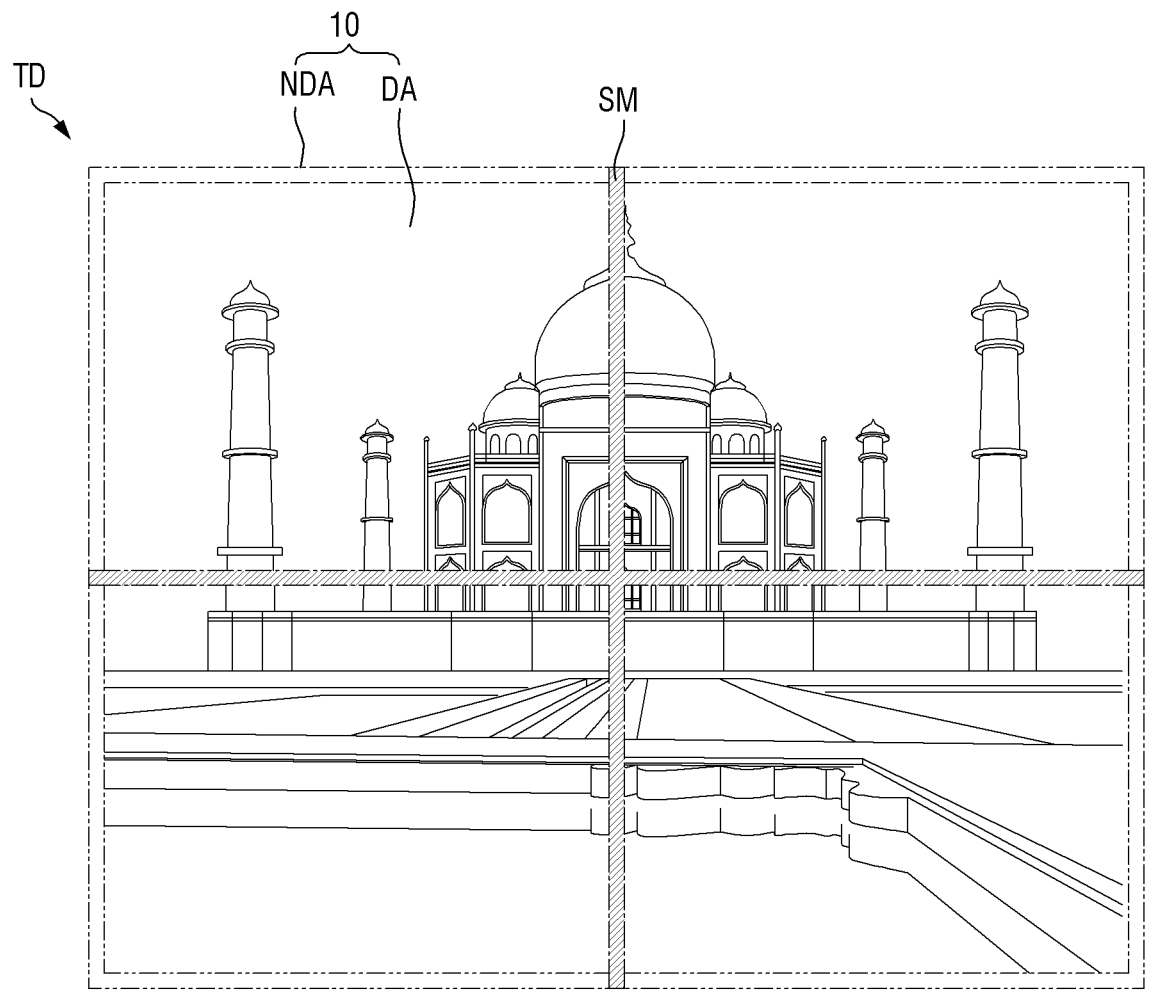
FIG. 1 is a plan view illustrating a tiled display device according to an embodiment.

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

When an element, such as a layer, is referred to as being "on", "connected to", or "coupled to" another element or layer, it may be directly on, connected to, or coupled to the other element or layer or intervening elements or layers may be present. When, however, an element or layer is referred to as being "directly on", "directly connected to", or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Each of the features of the various embodiments of the disclosure may be combined or combined with each other, in part or in whole, and technically various interlocking and driving are possible. Each embodiment may be implemented independently of each other or may be implemented together in an association.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Hereinafter, embodiments of the disclosure will be described with reference to the attached drawings.

FIG. 1 is a plan view illustrating a tiled display device according to an embodiment.

Referring to FIG. 1, a tiled display device TD may include multiple display devices 10. The display devices 10 may be arranged in a grid form, but are not limited thereto. The display devices 10 may be connected in a first direction (X-axis direction) and/or a second direction (Y-axis direction), and the tiled display device TD may have a particular shape. For example, the display devices 10 may have the same size, but are not limited thereto. In another embodiment, the display devices 10 may have different sizes.

Each of the display devices 10 may have a rectangular shape including long sides and short sides. The display devices 10 may be arranged such that the long sides and/or the short sides thereof are connected to each other. Some of the display devices 10 may be disposed at the edge of the tiled display device TD to form one side of the tiled display device TD. Some others of the display devices 10 may be disposed at corners of the tiled display device TD to form two adjacent sides of the tiled display device TD. Yet some others of the display devices 10 may be disposed on the inner side of the tiled display device TD, and may be surrounded by other display devices 10.

Each of the display devices 10 may include a display area DA and a non-display area NDA. The display area DA may include multiple pixels to display an image. Each of the pixels may include an organic light emitting diode including an organic light emitting layer, a quantum dot light emitting diode including a quantum dot light emitting layer, an inorganic light emitting element including an inorganic semiconductor or a micro LED. In the following, the case where each of the pixels includes an inorganic light emitting element will be described, but the disclosure is not limited thereto. The non-display area NDA may be disposed adjacent to the display area DA to at least partially surround the display area DA, and may not display an image.

The tiled display device TD may have a planar shape as a whole, but is not limited thereto. The tiled display device TD may have a three-dimensional shape to provide a three-dimensional effect to a user. For example, in case that the tiled display device TD has a three-dimensional shape, at least some of the display devices 10 may have a curved shape. In another embodiment, the display devices 10 may each have a planar shape and may be connected to each other with an angle, so that the tiled display device TD may have a three-dimensional shape.

The tiled display device TD may include a coupling area SM disposed between the display areas DA. The tiled display device TD may be formed by connecting non-display areas NDA of the adjacent display devices 10. The display devices 10 may be connected to each other through a bonding member or an adhesive member disposed in a coupling area SM. The coupling area SM of each of the display devices 10 may not include a pad member or a flexible film attached to the pad member. Accordingly, the distance between the display areas DA of the display devices 10 may be small enough that the coupling area SM between the display devices 10 is not recognized by the user. The reflectance of external light of the display areas DA of each of the display devices 10 may be substantially the same as that of the coupling area SM between the display devices 10. Accordingly, in the tiled display device TD, the coupling area SM between the display devices 10 may be prevented from being recognized by the user, thereby reducing a sense of disconnection between the display devices 10 and improving a sense of immersion in an image.

Figure 2:
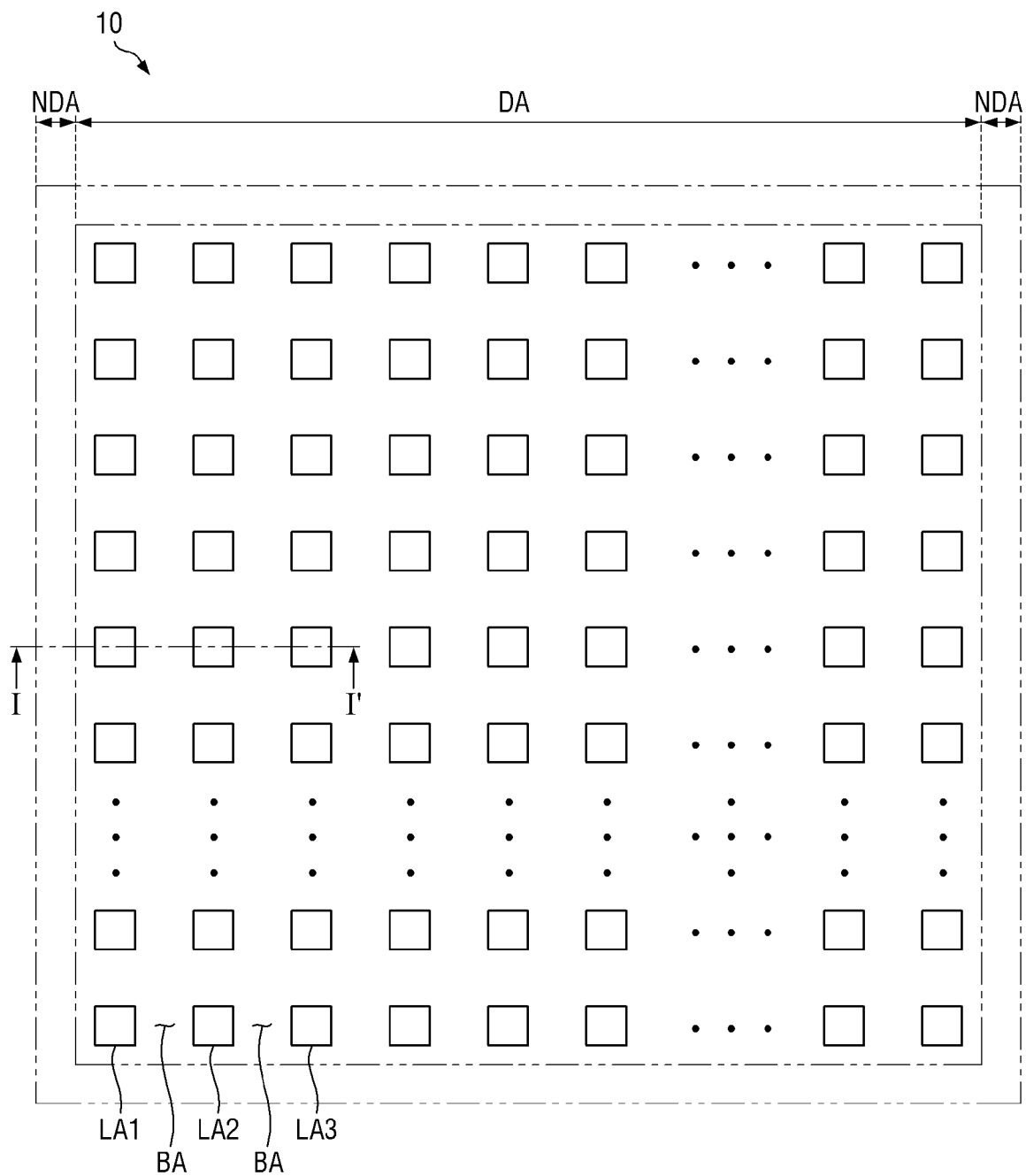
FIG. 2 is a plan view illustrating a display device according to an embodiment.
Figure 2:
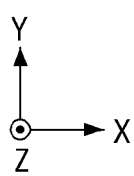

FIG. 2 is a plan view illustrating a display device according to an embodiment.

Referring to FIG. 2, the display device 10 may include multiple pixels arranged along multiple rows and columns in the display area DA. Each of the pixels may include an emission area LA defined by a pixel defining layer or bank, and may emit light having a peak wavelength through the emission area LA. For example, the display area DA of the display device 10 may include first to third emission areas LA1, LA2, and LA3. Each of the first to third emission areas LA1, LA2, and LA3 may be an area in which light generated from a light emitting element of the display device 10 is emitted to the outside of the display device 10.

The first to third emission areas LA1, LA2, and LA3 may emit light having a peak wavelength to the outside of the display device 10. The first emission area LA1 may emit light of a first color, the second emission area LA2 may emit light of a second color, and the third emission area LA3 may emit light of a third color. For example, the first color light may be red light having a peak wavelength in a range of about 610 nm to about 650 nm, the second color light may be green light having a peak wavelength in a range of about 510 nm to about 550 nm, and the third color light may be blue light having a peak wavelength in a range of about 440 nm to about 480 nm, but the disclosure is not limited thereto.

The first to third emission areas LA1, LA2, and LA3 may be sequentially arranged repetitively in the first direction (X-axis direction) in the display area DA. For example, the third emission area LA3 may be larger in size than the first emission area LA1, and the first emission area LA1 may be larger in size than the second emission area LA2. In another embodiment, the first emission area LA1, the second emission area LA2, and the third emission area LA3 may be substantially the same in size.

The display area DA of the display device 10 may include a light blocking area BA surrounding the emission areas LA. The light blocking area BA may prevent the colored lights emitted from the first to third emission areas LA1, LA2, and LA3 from mixing with one another.

Figure 3:
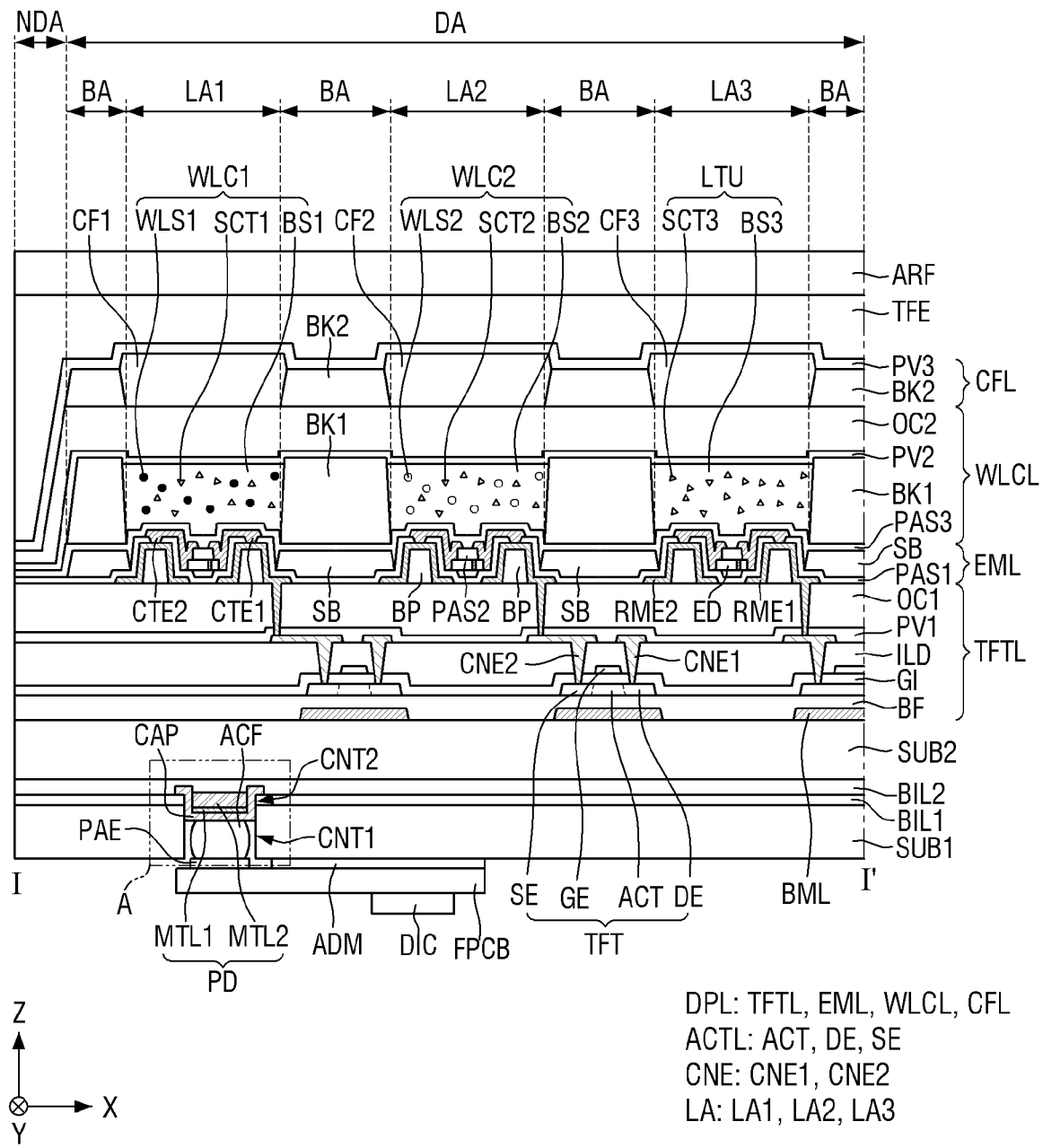
FIG. 3 is a schematic cross-sectional view taken along line I-I' of FIG. 2.
Figure 4:
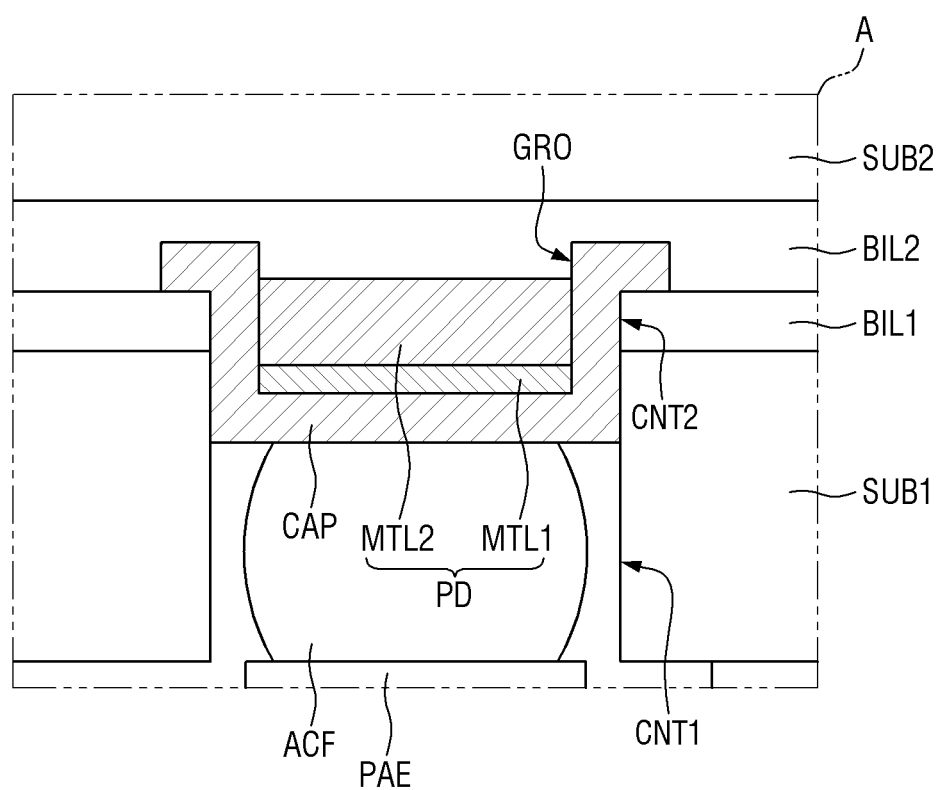
FIG. 4 is an enlarged view of region A of FIG. 3.
Figure 5:
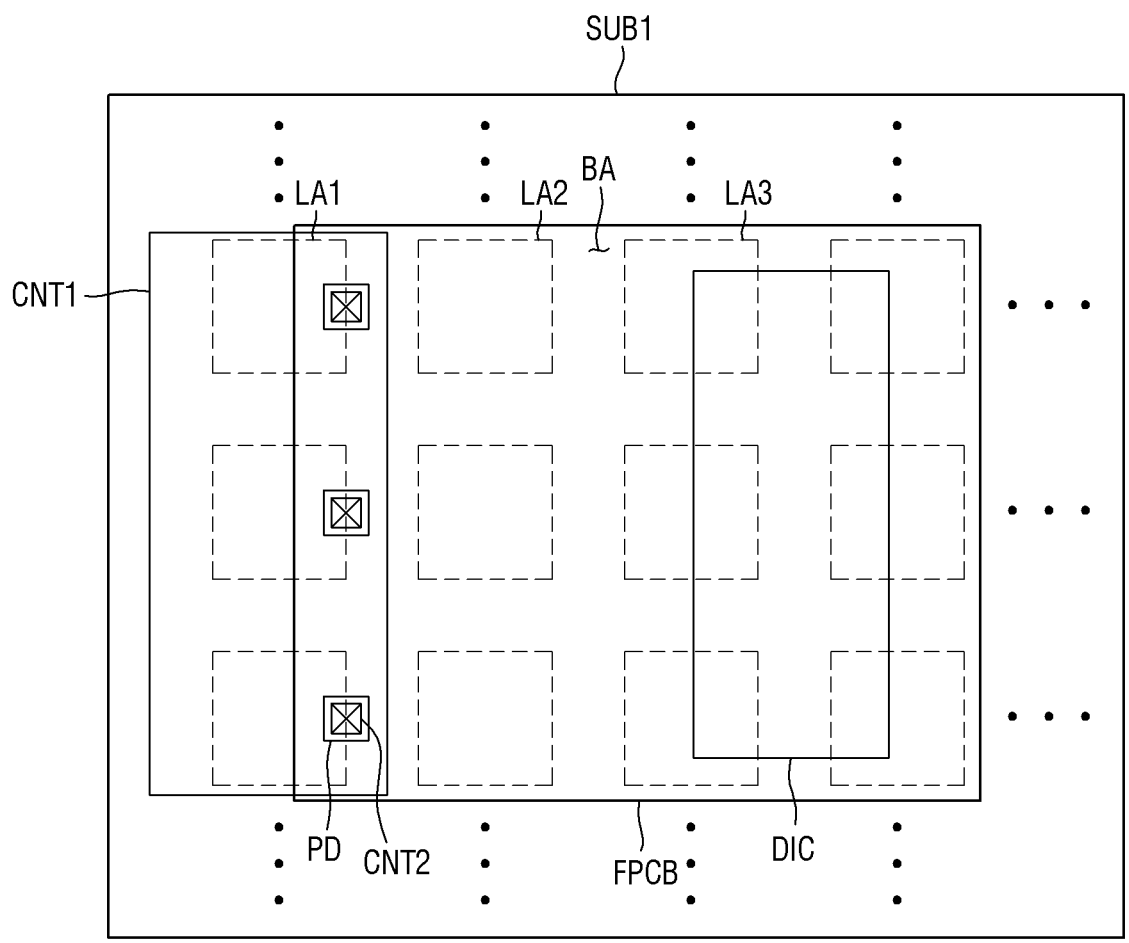
FIG. 5 is a bottom view showing a display device according to an embodiment.

FIG. 3 is a schematic cross-sectional view taken along line I-I' of FIG. 2. FIG. 4 is an enlarged view of region A of FIG. 3. FIG. 5 is a bottom view showing a display device according to an embodiment.

Referring to FIGS. 3 to 5, the display area DA of the display device 10 may include first to third emission areas LA1, LA2, and LA3. Each of the first to third emission areas LA1, LA2, and LA3 may be an area in which light generated from the light emitting element ED of the display device 10 is emitted to the outside of the display device 10.

The display device 10 may include a first substrate SUB1, a first barrier insulating layer BIL1, a capping layer CAP, a pad electrode PD, a second barrier insulating layer BIL2, a second substrate SUB2, a display layer DPL, an encapsulation layer TFE, an anti-reflection film ARF, a flexible film FPCB, and a display driver DIC.

The first substrate SUB1 may support the display device 10. The first substrate SUB1 may be a base substrate or a base member. The first substrate SUB1 may be a flexible substrate which can be bent, folded or rolled. For example, the first substrate SUB1 may include an insulating material such as a polymer resin such as polyimide (PI), but the disclosure is not limited thereto. In another embodiment, the first substrate SUB1 may be a rigid substrate including a glass material.

The first substrate SUB1 may include a first contact hole CNT1. The first contact hole CNT1 may be etched from the bottom surface of the first substrate SUB1 to penetrate to the top surface of the first substrate SUB1. The first contact hole CNT1 may be a through hole that penetrates the first substrate SUB1. For example, the lower width of the first contact hole CNT1 may be greater than the upper width of the first contact hole CNT1. The first contact hole CNT1 may overlap the capping layer CAP and the pad electrode PD in a thickness direction (Z-axis direction). In the manufacturing process of the display device 10, the first contact hole CNT1 may expose the bottom surface of the capping layer CAP. The first contact hole CNT1 may expose the capping layer CAP to bond the flexible film FPCB and the capping layer CAP.

The first barrier insulating layer BIL1 may be disposed on the first substrate SUB1. The first barrier insulating layer BIL1 may include an inorganic film that is capable of preventing air or moisture infiltration. For example, the first barrier insulating layer BIL1 may include at least one of a silicon nitride layer, a silicon oxynitride layer, a silicon oxide layer, a titanium oxide layer, an aluminum oxide layer, and an amorphous silicon layer, but the disclosure is not limited thereto.

The first barrier insulating layer BIL1 may include a second contact hole CNT2. The second contact hole CNT2 may be etched from the bottom surface of the first barrier insulating layer BIL1 to penetrate to the top surface of the first barrier insulating layer BIL1. The second contact hole CNT2 may be a through hole that penetrates the first barrier insulating layer BIL1 In the manufacturing process of the display device 10, the second contact hole CNT2 may expose the capping layer CAP.

The capping layer CAP may be disposed on the first barrier insulating layer BIL1 In the manufacturing process of the display device 10, the capping layer CAP may prevent damage of the pad electrode PD and reduce contact resistance between the pad electrode PD and the flexible film FPCB during etching process the first substrate SUB1. The capping layer CAP may protect the pad electrode PD from external environment during the process.

The capping layer CAP may overlap the first contact hole CNT1 and the second contact hole CNT2 and may be exposed to the outside by the first contact hole CNT1 and the second contact hole CNT2. The capping layer CAP may be formed as a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd), or copper (Cu).

The pad electrode PD may be disposed on the first barrier insulating layer BIL1 and at least a portion of the pad electrode PD may be disposed on the capping layer CAP. The pad electrode PD may be disposed in the display area DA or may be disposed across the display area DA and the non-display area NDA. The display device 10 may minimize the area of the non-display area NDA by including a pad electrode PD disposed at least a part in the display area DA. The pad electrode PD may be electrically connected to the flexible film FPCB. The display device 10 may include a connection film ACF between the pad electrode PD and the flexible film FPCB. The pad electrode PD may be electrically connected to the flexible film FPCB through the connection film ACF. Also, although not illustrated, the pad electrode PD may be electrically connected to a thin film transistor TFT of a pixel. Accordingly, the pad electrode PD may supply an electrical signal received from the flexible film FPCB to the thin film transistor TFT of the pixel.

According to an embodiment, the capping layer CAP may have a structure protruding toward the first substrate SUB1. The capping layer CAP may extend from the top portion of the first barrier insulating layer BIL1 to the inside of the first contact hole CNT1 and the second contact hole CNT2. For example, an edge of the capping layer CAP may be disposed on the top surface of the first barrier insulating layer BIL1 and a central portion of the capping layer CAP may be disposed inside the second contact hole CNT2 of the first barrier insulating layer BIL1 and the first contact hole CNT1 of the first substrate SUB1.

As will be described later, the capping layer CAP may be disposed on the first barrier insulating layer BIL1 on the first substrate SUB1 and may be used when etching the first substrate SUB1 to form the first contact hole CNT1. To form the second contact hole CNT2, the etching process may over-etch a portion of the first substrate SUB1. As the capping layer CAP is disposed on the second contact hole CNT2, the capping layer CAP may be formed on the top surface of the first barrier insulating layer BIL1 and inside the second contact hole CNT2. Accordingly, the bottom surface of the capping layer CAP disposed in the second contact hole CNT2 may be disposed lower than the top surface of the first substrate SUB1. The top surface of the capping layer CAP disposed inside the second contact hole CNT2 may be disposed lower than the top surface of the first substrate SUB1.

The pad electrode PD may be disposed to be surrounded by the capping layer CAP. For example, the pad electrode PD may be disposed inside a groove GRO formed by the step of the capping layer CAP. As described above, the capping layer CAP may be disposed to extend from the top surface of the first barrier insulating layer BIL1 to the inside of the first contact hole CNT1 and the second contact hole CNT2. The central portion of the capping layer CAP overlapping the first contact hole CNT1 and the second contact hole CNT2 may be disposed lower than the edge of the capping layer CAP to form the groove GRO in a recessed shape. The pad electrode PD may be disposed in the groove GRO formed by the step of the capping layer CAP so that the bottom surface and the lateral sides of the pad electrode PD may be surrounded by the capping layer CAP.

The pad electrode PD may include a first metal layer MTL1 and a second metal layer MTL2. The first metal layer MTL1 may form the bottom surface of the pad electrode PD and the second metal layer MTL2 may be disposed on the first metal layer MTL1 to form the top layer of the pad electrode PD. The first metal layer MTL1 may be disposed to contact the top surface of the capping layer CAP inside the groove GRO and the second metal layer MTL2 may be disposed to contact the lateral surface of the capping layer CAP inside the groove GRO.

The first metal layer MTL1 may be disposed lower than the top surface of the first substrate SUB1. As described above, the first metal layer MTL1 formed on the capping layer CAP may be disposed lower than the top surface as the capping layer CAP is disposed to protrude inward the first contact hole CNT1 inside the first substrate SUB1. For example, the top surface of the first metal layer MTL1 may be disposed lower than the top surface of the first substrate SUB1.

A portion of the second metal layer MTL2 may be disposed lower than the top surface of the first substrate SUB1. For example, the bottom surface of the second metal layer MTL2 may be disposed lower than the top surface of the first substrate SUB1 and the top surface of the second metal layer MTL2 may be disposed higher than the top surface of the first substrate SUB1.

The first metal layer MTL1 and the second metal layer MTL2 may include metal. The first metal layer MTL1 may serve to cap the second metal layer MTL2 and the second metal layer MTL2 may serve as a low-resistance wiring of the pad electrode PD. For example, the first metal layer MTL1 may include titanium (Ti), and the second metal layer MTL2 may include copper (Cu). However, the disclosure is not limited thereto, and any metal may be used as the second metal layer MTL2 as long as it has a low resistance. The thickness of the first metal layer MTL1 may be about 100 Å to about 300 Å, and the thickness of the second metal layer MTL2 may be about 3000 Å to about 5000 Å. However, the disclosure is not limited thereto.

As described above, the capping layer CAP may be disposed to have a structure surrounding the pad electrode PD from the lower side of the capping layer CAP. As will be described later, the etching process for forming the first contact hole CNT1 on the first substrate SUB1 may be performed under the first substrate SUB1. The capping layer CAP may protect the pad electrode PD from the etching process of the first contact hole CNT1 by surrounding and covering the pad electrode PD. The capping layer CAP may improve the reliability of the display device by protecting the pad electrode PD from external environment.

The second barrier insulating layer BIL2 may be disposed on the first barrier insulating layer BIL1 the capping layer CAP, and the pad electrode PD. The second barrier insulating layer BIL2 may insulate the capping layer CAP and the pad electrode PD. The second barrier insulating layer BIL2 may include an inorganic film that is capable of preventing air or moisture infiltration. For example, the second barrier insulating layer BIL2 may include at least one of a silicon nitride layer, a silicon oxynitride layer, a silicon oxide layer, a titanium oxide layer, an aluminum oxide layer, or an amorphous silicon layer, but the disclosure is not limited thereto.

The second substrate SUB2 may be disposed on the second barrier insulating layer BIL2. The second substrate SUB2 may be a base substrate or a base member. The second substrate SUB2 may be a flexible substrate which can be bent, folded or rolled. For example, the second substrate SUB2 may include an insulating material such as a polymer resin such as polyimide (PI), but the disclosure is not limited thereto.

The display layer DPL may be disposed on the second substrate SUB2. The display layer DPL may include a thin film transistor TFTL, a light emitting element layer EML, a wavelength conversion layer WLCL, and a color filter layer CFL.

The thin film transistor TFTL may include a lower metal layer BML, a buffer layer BF, an active layer ACTL, a gate insulating layer GI, a gate electrode GE, an interlayer insulating layer ILD, a connection electrode layer CNE, a first passivation layer PV1, and a first planarization layer OC1.

The lower metal layer BML may be disposed on the second substrate SUB2. The lower metal layer BML may overlap the thin film transistor TFT in the thickness direction (Z-axis direction) to block external light incident on the thin film transistor TFT. In another embodiment, the lower metal layer BML may include a data line or a power line. The lower metal layer BML may be formed as a single layer or multiple layers including any one of molybdenum (Mo), aluminum (Al), chromium (Cr), gold (Au), silver (Ag), titanium (Ti), nickel (Ni), palladium (Pd), indium (In), neodymium (Nd), and copper (Cu).

The buffer layer BF may be disposed on the lower metal layer BML and the second substrate SUB2. The buffer layer BF may include an inorganic material capable of preventing permeation of air and/or moisture. For example, the buffer layer BF may include multiple inorganic layers alternately stacked each other.

The active layer ACTL may be disposed on the buffer layer BF. The active layer ACTL may include a semiconductor area ACT, a drain electrode DE, and a source electrode SE of the thin film transistor TFT. The semiconductor area ACT may overlap the gate electrode GE in the thickness direction (Z-axis direction) and may be insulated from the gate electrode GE by the gate insulating layer GI. The drain electrode DE and the source electrode SE may be formed by conducting a material of the semiconductor area ACT. The thin film transistor TFT may constitute a pixel circuit of each of multiple pixels. For example, the thin film transistor TFT may be a driving transistor or a switching transistor of the pixel circuit.

The gate insulating layer GI may be disposed on the active layer ACTL and the buffer layer BF. The gate insulating layer GI may insulate the semiconductor area ACT of the thin film transistor TFT from the gate electrode GE. The gate insulating layer GI may include a contact hole through which the connection electrodes CNE passes.

The gate electrode GE may be disposed on the gate insulating layer GI. The gate electrode GE may overlap the semiconductor area ACT with the gate insulating layer GI interposed therebetween. The gate electrode GE may receive a gate signal from a gate line. For example, the gate electrode GE may be formed as a single layer or multiple layers including any one of molybdenum (Mo), aluminum (Al), chromium (Cr), gold (Au), silver (Ag), titanium (Ti), nickel (Ni), palladium (Pd), indium (In), neodymium (Nd), and copper (Cu).

The interlayer insulating layer ILD may be disposed on the gate electrode GE. The interlayer insulating layer ILD may insulate the gate electrode GE from the connection electrodes CNE. The interlayer insulating layer ILD may include a contact hole through which the connection electrodes CNE pass.

The connection electrodes CNE may be disposed on the interlayer insulating layer ILD. The connection electrodes CNE may include a first connection electrode CNE1 and a second connection electrode CNE2. The first connection electrode CNE1 and the second connection electrode CNE2 may be formed of the same material in the same layer, but the disclosure is not limited thereto. For example, the first connection electrode CNE1 and the second connection electrode CNE2 may be formed as a single layer or multiple layers including any one of molybdenum (Mo), aluminum (Al), chromium (Cr), gold (Au), silver (Ag), titanium (Ti), nickel (Ni), palladium (Pd), indium (In), neodymium (Nd) and copper (Cu).

The first connection electrode CNE1 may electrically connect a data line or a power line to the drain electrode DE of the thin film transistor TFT. The first connection electrode CNE1 may electrically contact the drain electrode DE through a contact hole formed in the interlayer insulating layer ILD and the gate insulating layer GI. The second connection electrode CNE2 may electrically connect the source electrode SE of the thin film transistor TFT to a first electrode RME1. The second connection electrode CNE2 may electrically contact the source electrode SE through a contact hole formed in the interlayer insulating layer ILD and the gate insulating layer GI.

The first passivation layer PV1 may be disposed on the connection electrodes CNE and the interlayer insulating layer ILD. The first passivation layer PV1 may protect the thin film transistor TFT. The first passivation layer PV1 may include a contact hole through which the first electrode RME1 passes.

The first planarization layer OC1 may be disposed on the first passivation layer PV1. The first planarization layer OC1 may planarize the top portion of the thin film transistor layer TFTL. For example, the first planarization layer OC1 may include a contact hole through which the first electrode RME1 passes. The contact hole of the first planarization layer OC1 may be electrically connected to the contact hole of the first passivation layer PV1. The first planarization layer OC1 may contain an organic insulating material such as polyimide (PI).

The light emitting element layer EML may be disposed on the thin film transistor TFTL. The light emitting element layer EML may include bank patterns BP, a first electrode RME1, a second electrode RME2, a first insulating layer PAS1, a sub-bank SB, a light emitting element ED, a second insulating layer PAS2, a first contact electrode CTE1, a second contact electrode CTE2, and a third insulating layer PASS.

The bank patterns BP may be disposed on the first planarization layer OC1. The bank patterns BP may protrude from the top surface of the first planarization layer OC1. The bank patterns BP may extend in a second direction (Y-axis direction) and may be disposed to be spaced apart from each other in the first direction (X-axis direction). The bank patterns BP may be disposed in the opening area or the emission area LA of each of the pixels. The light emitting elements ED may be disposed between the bank patterns BP. The bank patterns BP may have inclined side surfaces, and light emitted from the light emitting elements ED may be reflected by the first and second electrodes RME1 and RME2 disposed on the bank patterns BP. For example, the bank patterns BP may contain an organic insulating material such as polyimide (PI).

The first electrode RME1 may be disposed on the first planarization layer OC1 and the bank patterns BP. The first electrode RME1 may be disposed on the bank pattern BP that is disposed on a side of the light emitting elements ED. The first electrode RME1 may be disposed on an inclined side surface of the bank pattern BP to reflect light emitted from the light emitting element ED. The first electrode RME1 may be inserted into a contact hole formed in the first planarization layer OC1 and the first passivation layer PV1 to be electrically connected to the second connection electrode CNE2. The first electrode RME1 may be electrically connected to an end of the light emitting element ED through the first contact electrode CTE1. For example, the first electrode RME1 may receive a voltage proportional to the luminance of the light emitting element ED from the thin film transistor TFT of the pixel.

The second electrode RME2 may be disposed on the first planarization layer OC1 and the bank pattern BP. The second electrode RME2 may be disposed on the bank pattern BP that is disposed on another side of the light emitting elements ED. The second electrode RME2 may be disposed on an inclined side surface of the bank pattern BP to reflect light emitted from the light emitting element ED. The second electrode RME2 may be electrically connected to another end of the light emitting element ED through the second contact electrode CTE2. For example, the second electrode RME2 may receive a low potential voltage supplied to the entire pixels from a low potential line.

The first and second electrodes RME1 and RME2 may include a conductive material having a high reflectivity. For example, the first and second electrodes RME1 and RME2 may include at least one of aluminum (Al), silver (Ag), copper (Cu), nickel (Ni), and lanthanum (La). In another embodiment, the first and second electrodes RME1 and RME2 may include a material such as indium tin oxide (ITO), indium zinc oxide (IZO), or indium tin zinc oxide (ITZO). In still another embodiment, the first and second electrodes RME1 and RME2 may include multiple layers including a transparent conductive material layer and a metal layer having high reflectivity, or may include one layer containing a transparent conductive material and a metal having high reflectivity. The first and second electrodes RME1 and RME2 may have a stacked structure of ITO/Ag/ITO, ITO/Ag/IZO, ITO/Ag/ITZO/IZO, or the like.

The first insulating layer PAS1 may be disposed on the first planarization layer OC1 and first and second electrodes RME1 and RME2. The first insulating layer PAS1 may protect and insulate the first electrode RME1 and the second electrode RME2 from each other. The first insulating layer PAS1 may prevent damage caused by direct contact between the light emitting element ED and the first and second electrodes RME1 and RME2 in an alignment process of the light emitting element ED.

The sub-banks SB may be disposed to overlap the light blocking area BA on the first insulating layer PAS1. The sub-banks SB may be disposed at the boundary of the adjacent pixels to distinguish the pixels. The sub-banks SB may have a height and contain an organic insulating material such as polyimide (PI).

The light emitting elements ED may be disposed on the first insulating layer PAS1. The light emitting elements ED may be aligned parallel to each other between the first and second electrodes RME1 and RME2. The length of the light emitting element ED may be greater than the length between the first and second electrodes RME1 and RME2. The light emitting element ED may include multiple semiconductor layers, and an end and another end opposite to the end may be defined with respect to a semiconductor layer. An end of the light emitting element ED may be disposed on the first electrode RME1, and another end of the light emitting element ED may be disposed on the second electrode RME2. An end of the light emitting element ED may be electrically connected to the first electrode RME1 through the first contact electrode CTE1, and another end of the light emitting element ED may be electrically connected to the second electrode RME2 through the second contact electrode CTE2.

The light emitting element ED may have a micro-meter or nano-meter size, and may be an inorganic light emitting diode including an inorganic material. The inorganic light emitting diode may be aligned between the first electrode RME1 and the second electrode RME2 facing each other by the electric field formed in a specific direction between the first electrode RME1 and the second electrode RME2.

For example, multiple light emitting elements ED may include active layers having the same material and may emit light of the same wavelength band or light of the same color. The lights emitted from the first to third emission areas LA1, LA2, and LA3 of the light emitting element layer EML may have the same color. For example, the light emitting elements ED may emit light of a third color or blue light having a peak wavelength in the range of about 440 nm to about 480 nm, but the disclosure is not limited thereto.

The second insulating layer PAS2 may be disposed on the light emitting elements ED. For example, the second insulating layer PAS2 may partially surround the light emitting elements ED and may not cover both ends of the light emitting elements ED. The second insulating layer PAS2 may protect the light emitting elements ED and may fix the light emitting elements ED in the manufacturing process of the display device 10. The second insulating layer PAS2 may fill the space between the light emitting element ED and the first insulating layer PAS1.

The first contact electrode CTE1 may be disposed on the first insulating layer PAS1 and may be electrically connected to the first electrode RME1 while being inserted into the contact hole provided in the first insulating layer PAS1. For example, the contact hole of the first insulating layer PAS1 may be formed on the bank pattern BP, but the disclosure is not limited thereto. An end of the first contact electrode CTE1 may be electrically connected to the first electrode RME1 on the bank pattern BP, and another end of the first contact electrode CTE1 may be electrically connected to an end of the light emitting element ED.

The second contact electrode CTE2 may be disposed on the first insulating layer PAS1 and may be electrically connected to the second electrode RME2 while being inserted into the contact hole provided in the first insulating layer PAS1. For example, the contact hole of the first insulating layer PAS1 may be disposed on the bank pattern BP, but the disclosure is not limited thereto. An end of the second contact electrode CTE2 may be electrically connected to another end of the light emitting element ED, and another end of the second contact electrode CTE2 may be electrically connected to the second electrode RME2 on the bank pattern BP.

The third insulating layer PAS3 may be disposed on the first and second contact electrodes CTE1 and CTE2, the sub-bank SB, and the first and second insulating layers PAS1 and PAS2. The third insulating layer PAS3 may be disposed on the light emitting element layer EML to protect the light emitting element layer EML.

The wavelength conversion layer WLCL may be disposed on the light emitting element layer EML. The wavelength conversion layer WLCL may include a first light blocking member BK1, a first wavelength conversion member WLC1, a second wavelength conversion member WLC2, a light transmission member LTU, a second passivation layer PV2, and a second planarization layer OC2.

The first light blocking member BK1 may be disposed on the third insulating layer PAS3 and may overlap the light blocking area BA in the thickness direction. The first light blocking member BK1 may overlap the sub-bank SB in the thickness direction (Z-axis direction). The first light blocking member BK1 may block transmission of light. The first light blocking member BK1 may prevent color mixture between the first to third emission areas LA1, LA2, and LA3, which leads to the improvement of color reproducibility of the display device 10. The first light blocking member BK1 may be arranged in the form of a grid surrounding the first to third emission areas LA1, LA2, and LA3 in a plan view.

The first wavelength conversion member WLC1 may be disposed on the third insulating layer PAS3 in the first emission area LA1. The first wavelength conversion member WLC1 may be surrounded by the first light blocking member BK1. The first wavelength conversion member WLC1 may include a first base resin BS1, a first scatterer SCT1, and a first wavelength shifter WLS1.

The first base resin BS1 may contain a material having a relatively high light transmittance. The first base resin BS1 may include a transparent organic material. For example, the first base resin BS1 may contain at least one organic materials such as epoxy resin, acrylic resin, cardo resin, or imide resin.

The first scatterer SCT1 may have a refractive index different from that of the first base resin BS1 and may form an optical interface with the first base resin BS1. For example, the first scatterer SCT1 may contain a light scattering material or light scattering particles that scatter at least a portion of the transmitted light. For example, the first scatterer SCT1 may contain a metallic oxide such as titanium oxide ($TiO_2$), zirconium oxide ($ZrO_2$), aluminum oxide ($AL_2O_3$), indium oxide ($In_2O_3$), zinc oxide (ZnO), or tin oxide ($SnO_2$), or may contain organic particles such as acrylic resin or urethane resin. The first scatterer SCT1 may scatter light in random directions regardless of the incidence direction of the incident light without any substantial change of the peak wavelength of the incident light.

The first wavelength shifter WLS1 may change or shift the peak wavelength of the incident light to a first peak wavelength. For example, the first wavelength shifter WLS1 may convert blue light provided from the display device 10 into red light having a single peak wavelength in the range of about 610 nm to about 650 nm and may emit the red light. The first wavelength shifter WLS1 may be a quantum dot, a quantum rod, or a fluorescent substance. The quantum dot may be a particulate material that emits light of a specific color as an electron transitions from a conduction band to a valence band.

A portion of the blue light emitted from the light emitting element layer EML may pass through the first wavelength conversion member WLC1 without being converted to red light by the first wavelength shifter WLS1. The portion of the blue light emitted from the light emitting element layer EML incident on a first color filter CF1 without being converted by the first wavelength conversion member WLC1 may be blocked by the first color filter CF1. The red light provided by the first wavelength conversion member WLC1 converting the blue light emitted from the light emitting element layer EML may pass through the first color filter CF1 to be emitted to the outside. Accordingly, the red light may be emitted through the first emission area LA1.

The second wavelength conversion member WLC2 may be disposed on the third insulating layer PAS3 in the second emission area LA2. The second wavelength conversion member WLC2 may be surrounded by the first light blocking member BK1. The second wavelength conversion member WLC2 may include a second base resin BS2, a second scatterer SCT2, and a second wavelength shifter WLS2.

The second base resin BS2 may contain a material having a relatively high light transmittance. The second base resin BS2 may include a transparent organic material. For example, the second base resin BS2 may be made of the same material as the first base resin BS1, or may be made of the material that may be used to form the first base resin BS1, e.g., as described herein.

The second scatterer SCT2 may have a refractive index different from that of the second base resin BS2 and may form an optical interface with the second base resin BS2. For example, the second scatterer SCT2 may contain a light scattering material or light scattering particles scattering at least a portion of the transmitted light. For example, the second scatterer SCT2 may be made of the same material as the first scatterer SCT1, or may be made of the material that may be used to form the first scatterer SCT1, e.g., as described herein.

The second wavelength shifter WLS2 may change or shift the peak wavelength of the incident light to a second peak wavelength different from the first peak wavelength of the first wavelength shifter WLS1. For example, the second wavelength shifter WLS2 may convert blue light provided from the display device 10 into green light having a single peak wavelength in the range of about 510 nm to about 550 nm and may emit the green light. The second wavelength shifter WLS2 may be a quantum dot, a quantum rod, or a fluorescent substance. The second wavelength shifter WLS2 may contain the materials that may be used to form the first wavelength shifter WLS1, e.g., as described herein. The second wavelength shifter WLS2 may be a quantum dot, a quantum rod, or a fluorescent substance to have a wavelength conversion range different from that of the first wavelength shifter WLS1.

A portion of the blue light emitted from the light emitting element layer EML may pass through the second wavelength conversion member WLC2 without being converted to green light by the second wavelength shifter WLS2. The portion of the blue light emitted from the light emitting element layer EML incident on a second color filter CF2 without being converted by the second wavelength conversion member WLC2 may be blocked by the second color filter CF2. The green light provided by the second wavelength conversion member WLC2 converting the blue light emitted from the light emitting element layer EML may pass through the second color filter CF2 to be emitted to the outside. Accordingly, the green light may be emitted through the second emission area LA2.

The light transmission member LTU may be disposed on the third insulating layer PAS3 in the third emission area LA3. The light transmission member LTU may be surrounded by the first light blocking member BK1. The light transmission member LTU may allow the incident light to pass therethrough while maintaining the peak wavelength of the light. The light transmission member LTU may include a third base resin BS3 and a third scatterer SCT3.

The third base resin BS3 may contain a material having a relatively high light transmittance. The third base resin BS3 may include a transparent organic material. For example, the third base resin BS3 may be made of the same material as the first base resin BS1 or the second base resin BS2, or may be made of the material that may be used to form the first base resin BS1, e.g., as described herein.

The third scatterer SCT3 may have a refractive index different from that of the third base resin BS3 and may form an optical interface with the third base resin BS3. For example, the third scatterer SCT3 may contain a light scattering material or light scattering particles scattering at least a portion of the transmitted light. For example, the third scatterer SCT3 may be formed of the same material as the first scatterer SCT1 or the second scatterer SCT2, or may be made of the material that may be used to form the first scatterer SCT1, e.g., as described herein.

Since the wavelength conversion layer WLCL is disposed directly on the third insulating layer PAS3 of the light emitting element layer EML, the display device 10 may not require a separate substrate for the first and second wavelength conversion members WLC1 and WLC2 and the light transmission member LTU. Accordingly, the first and second wavelength conversion members WLC1 and WLC2 and the light transmission member LTU may be readily aligned in the first to third emission areas LA1, LA2, and LA3, respectively, and the thickness of the display device 10 may be relatively reduced.

The second passivation layer PV2 may cover the first and second wavelength conversion members WLC1 and WLC2, the light transmission member LTU, and the first light blocking member BK1. For example, the second passivation layer PV2 may seal the first and second wavelength conversion members WLC1 and WLC2 and the light transmission member LTU to prevent the first and second wavelength conversion members WLC1 and WLC2 and the light transmission member LTU from damage or contamination. For example, the second passivation layer PV2 may contain an inorganic material.

The second planarization layer OC2 may be disposed on the second passivation layer PV2 to provide a flat upper surface of the first and second wavelength conversion members WLC1 and WLC2 and the light transmission member LTU. For example, the second planarization layer OC2 may contain an organic insulating material such as polyimide (PI).

The color filter layer CFL may be disposed on the wavelength conversion layer WLCL. The color filter layer CFL may include a second light blocking member BK2, first to third color filters CF1, CF2, and CF3, and a third passivation layer PV3.

The second light blocking member BK2 may be disposed on the second planarization layer OC2 of the wavelength conversion layer WLCL and may overlap the light blocking area BA in thickness direction. The second light blocking member BK2 may overlap the first light blocking member BK1 and/or the sub-bank SB in the thickness direction (Z-axis direction). The second light blocking member BK2 may block transmission of light. The second light blocking member BK2 may prevent color mixture between the first to third emission areas LA1, LA2, and LA3, which leads to the improvement of color reproducibility of the display device 10. The second light blocking member BK2 may be arranged in the form of a grid surrounding the first to third emission areas LA1, LA2, and LA3 in a plan view.

The first color filter CF1 may be disposed on the second planarization layer OC2 in the first emission area LA1. The first color filter CF1 may be surrounded by the second light blocking member BK2. The first color filter CF1 may overlap the first wavelength conversion member WLC1 in the thickness direction (Z-axis direction). The first color filter CF1 may selectively allow the first color light (e.g., red light) to pass therethrough, and may block or absorb the second color light (e.g., green light) and the third color light (e.g., blue light). For example, the first color filter CF1 may be a red color filter and may contain a red colorant.

The second color filter CF2 may be disposed on the second planarization layer OC2 in the second emission area LA2. The second color filter CF2 may be surrounded by the second light blocking member BK2. The second color filter CF2 may overlap the second wavelength conversion member WLC2 in the thickness direction (Z-axis direction). The second color filter CF2 may selectively allow the second color light (e.g., green light) to pass therethrough, and may block or absorb the first color light (e.g., red light) and the third color light (e.g., blue light). For example, the second color filter CF2 may be a green color filter and may contain a green colorant.

The third color filter CF3 may be disposed on the second planarization layer OC2 in the third emission area LA3. The third color filter CF3 may be surrounded by the second light blocking member BK2. The third color filter CF3 may overlap the light transmission member LTU in the thickness direction (Z-axis direction). The third color filter CF3 may selectively allow the third color light (e.g., blue light) to pass therethrough, and may block or absorb the first color light (e.g., red light) and the second color light (e.g., green light). For example, the third color filter CF3 may be a blue color filter and may contain a blue colorant.

The first to third color filters CF1, CF2, and CF3 may absorb a portion of the light coming from the outside of the display device 10 to reduce the reflected light of the external light. Thus, the first to third color filters CF1, CF2, and CF3 may prevent color distortion caused by the reflection of the external light.

Since the first to third color filters CF1, CF2, and CF3 are directly disposed on the second planarization layer OC2 of the wavelength conversion layer WLCL, the display device 10 may not require a separate substrate for the first to third color filters CF1, CF2, and CF3. Therefore, the thickness of the display device 10 may be relatively reduced.

The third passivation layer PV3 may cover the first to third color filters CF1, CF2, and CF3. The third passivation layer PV3 may protect the first to third color filters CF1, CF2, and CF3.

The encapsulation layer TFE may be disposed on the third passivation layer PV3 of the color filter layer CFL. The encapsulation layer TFE may cover the top and side surfaces of the display layer DPL. For example, the encapsulation layer TFE may include at least one inorganic layer to prevent permeation of oxygen or moisture. The encapsulation layer TFE may include at least one organic layer to protect the display device 10 from foreign substances such as dust.

The anti-reflection film ARF may be disposed on the encapsulation layer TFE. The anti-reflection film ARF may prevent reflection of external light, thereby reducing a decrease in visibility due to reflection of external light. The anti-reflection film ARF may protect the top surface of the display device 10. The anti-reflection film ARF may be selectively omitted. In another embodiment, the anti-reflection film ARF may be replaced with a polarizing film.

The flexible film FPCB may be disposed on the bottom portion of the first substrate SUB1. The flexible film FPCB may be attached to the bottom surface of the first substrate SUB1 using an adhesive member ADM. Selectively, the adhesive member ADM may be omitted. The flexible film FPCB may support the display driver DIC disposed on the lower surface of the flexible film FPCB. A film pad PAE may be disposed on a side of the flexible film FPCB, for example, a surface facing the first substrate SUB1. The film pad PAE of the flexible film FPCB may be electrically connected to the pad electrode PD through the connection film ACF. Another side of the flexible film FPCB may be electrically connected to a source circuit board (not shown) under the first substrate SUB1. The flexible film FPCB may transmit a signal of the display driver DIC to the display device 10.

The display driver DIC may be an integrated circuit (IC). For example, the display driver DIC may convert digital video data to an analog data voltage based on a data control signal of a timing controller and may supply the analog data voltage to the data line of the display area DA through the flexible film FPCB. In another embodiment, the display driver DIC may generate a gate signal based on a gate control signal of the timing controller and may supply the gate signal to the gate line of the display area DA through the flexible film FPCB. Since the display device 10 includes the flexible film FPCB and the display driver DIC is disposed under the first substrate SUB1, it is possible to minimize the non-display area NDA in size.

Hereinafter, a method for manufacturing the display device 10 will be described with reference to other drawings.

FIGS. 6 to 14 are schematic cross-sectional views for each step illustrating a manufacturing process of a display device according to an embodiment.

Figure 6:
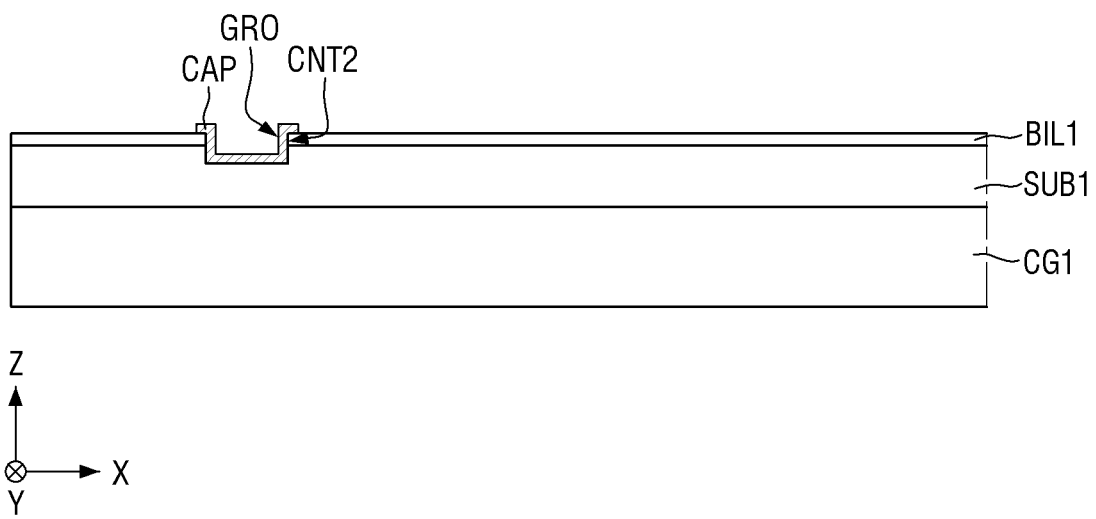
FIGS. 6 to 14 are schematic cross-sectional views for each step illustrating a manufacturing process of a display device according to an embodiment.

Referring to FIG. 6, a first carrier substrate CG1 may be prepared. The first carrier substrate CG1 may support the display device 10 in the manufacturing process of the display device 10. For example, the first carrier substrate CG1 may be a glass substrate, but the disclosure is not limited thereto.

The first substrate SUB1 may be formed on the first carrier substrate CG1. The first substrate SUB1 may be formed by applying an insulating material such as a polymer resin like polyimide PI through a solution process. The first substrate SUB1 may be a base substrate or a base member. The first barrier insulating layer BIL1 may be formed on the first substrate SUB1. The first barrier insulating layer BIL1 may be formed by stacking inorganic materials capable of preventing air or moisture infiltration each other.

The second contact hole CNT2 may be formed on the first barrier insulating layer BIL1. The second contact hole CNT2 may be formed by using a dry etching process. In the dry etching process, a portion of the top surface of the first substrate SUB1 may be etched by over-etching so that the first barrier insulating layer BIL1 may be completely removed. The second contact hole CNT2 may pass the first barrier insulating layer BIL1 and may be formed up to a portion of the first substrate SUB1.

The capping layer CAP may be formed on the first barrier insulating layer BIL1. The capping layer CAP may be formed by being stacked on the first barrier insulating layer BIL1 and patterned by a photolithography method. The capping layer CAP may be formed to extend to the inside of the second contact hole CNT2 from the top surface of the first barrier insulating layer BIL1. In an embodiment, the capping layer CAP may include materials that are not etched in an etching process for forming the first contact hole CNT1 of the first substrate SUB1 to be described later. The etching process may be performed by an atmospheric pressure plasma (AP Plasma) etching process using NF3 gas. The etching process may have a mechanism that a fluorine compound of the NF3 gas and the material to be etched forms a fluorine compound and the fluorine compound is vaporized and removed. The capping layer CAP may include a material in which a fluorine compound is not formed, and a transparent conductive material, for example, ITO, IZO, or indium gallium zinc oxide (IGZO), may be used.

Figure 7:
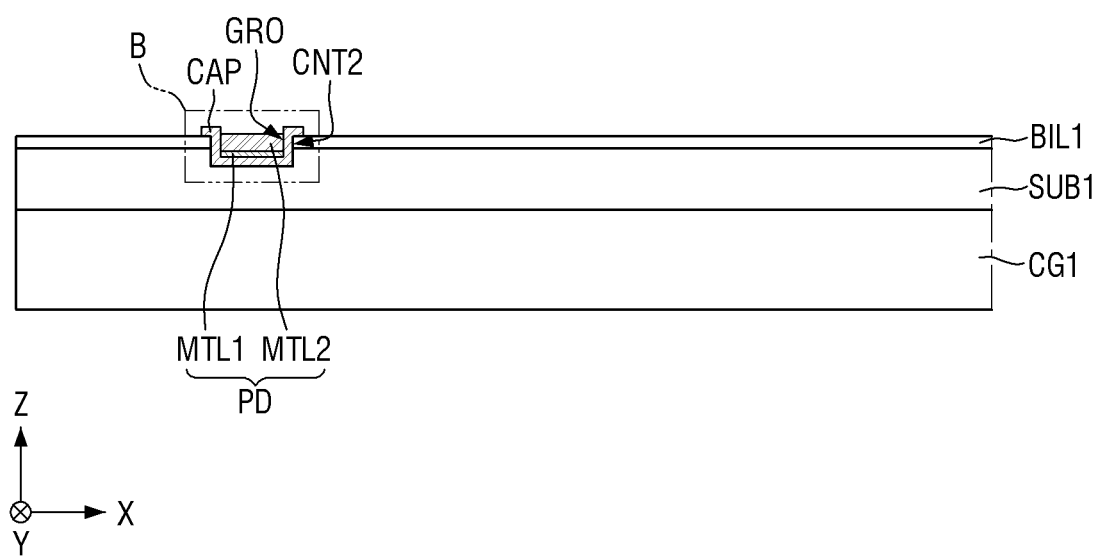
Figure 8:
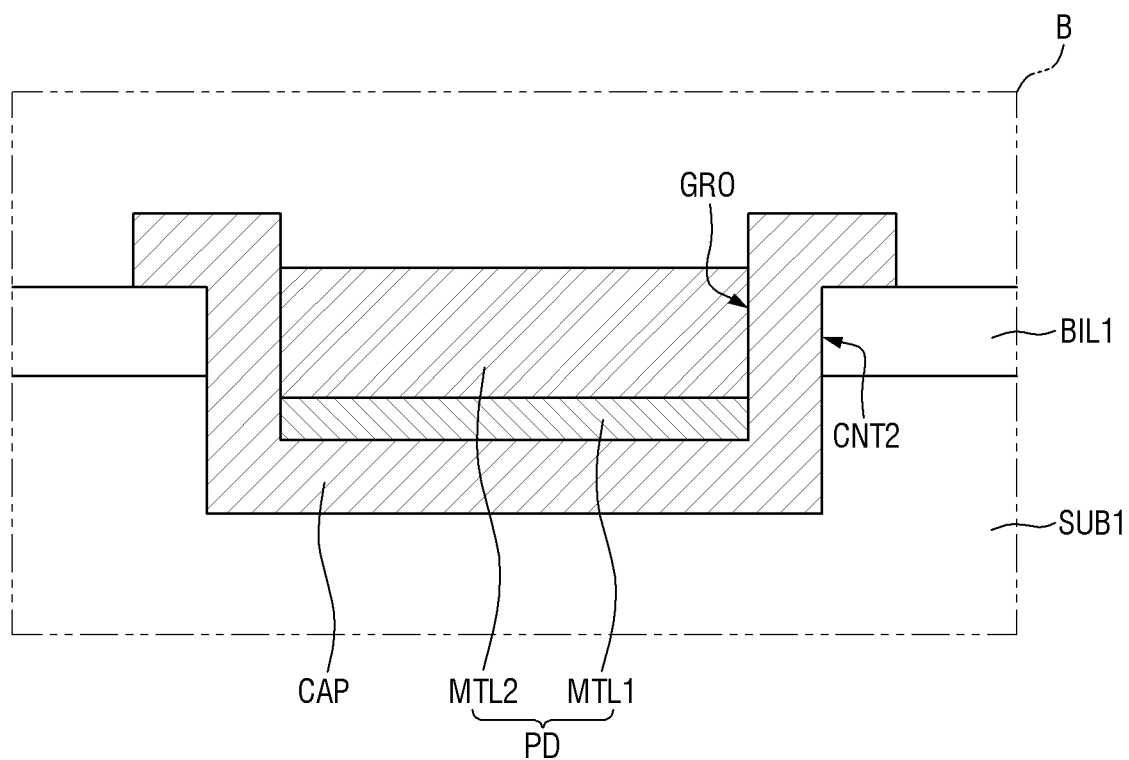

Referring to FIGS. 7 and 8, the pad electrode PD may be formed on the capping layer CAP. In the pad electrode PD, the first metal layer MTL1 and the second metal layer MTL2 of the pad electrode PD may be formed by sequentially stacking a first metal layer material and a second metal layer material and etching collectively. The pad electrode PD may be formed in the groove GRO of the capping layer CAP. According to an embodiment, the first metal layer MTL1 may be disposed lower than the top surface of the first metal layer MTL1, and the second metal layer MTL2 may be disposed so that the bottom surface of the second metal layer MTL2 is lower than the top surface of the first substrate SUB1 and the top surface of the second metal layer MTL2 is higher than the top surface of the first substrate SUB1.

Figure 9:
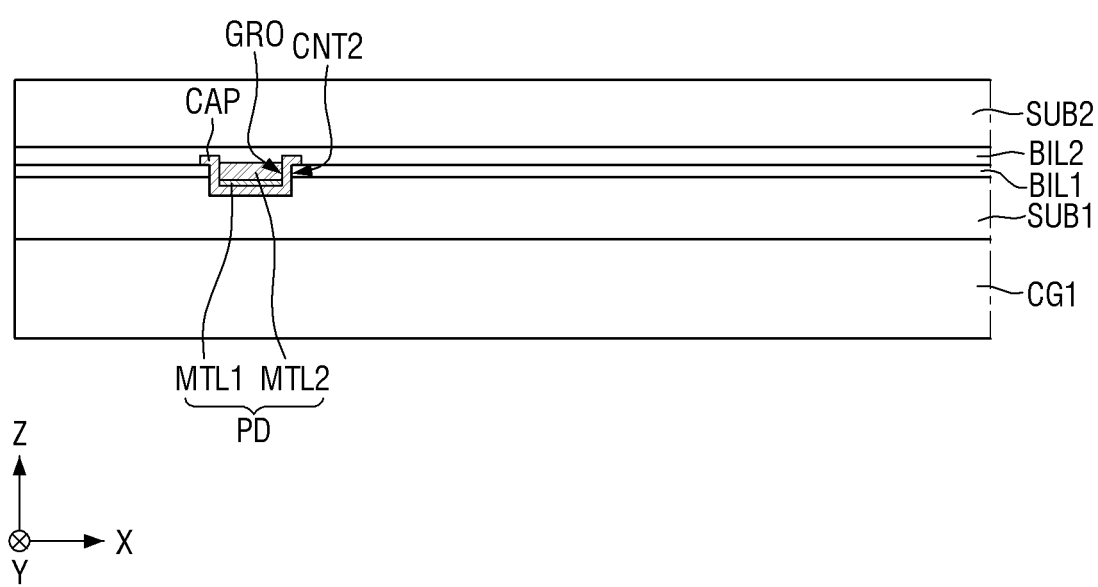

Referring to FIG. 9, the second barrier insulating layer BIL2 may be formed on the first barrier insulating layer BIL1, the capping layer CAP, and the pad electrode PD. The second barrier insulating layer BIL2 may be formed through the same process as the first barrier insulating layer BIL1 described above and may include an inorganic material capable of preventing permeation of air or moisture. The second substrate SUB2 may be formed on the second barrier insulating layer BIL2. The second substrate SUB2 may be formed through the same process as the first substrate SUB1 described above and may be made of the same material.

Figure 10:
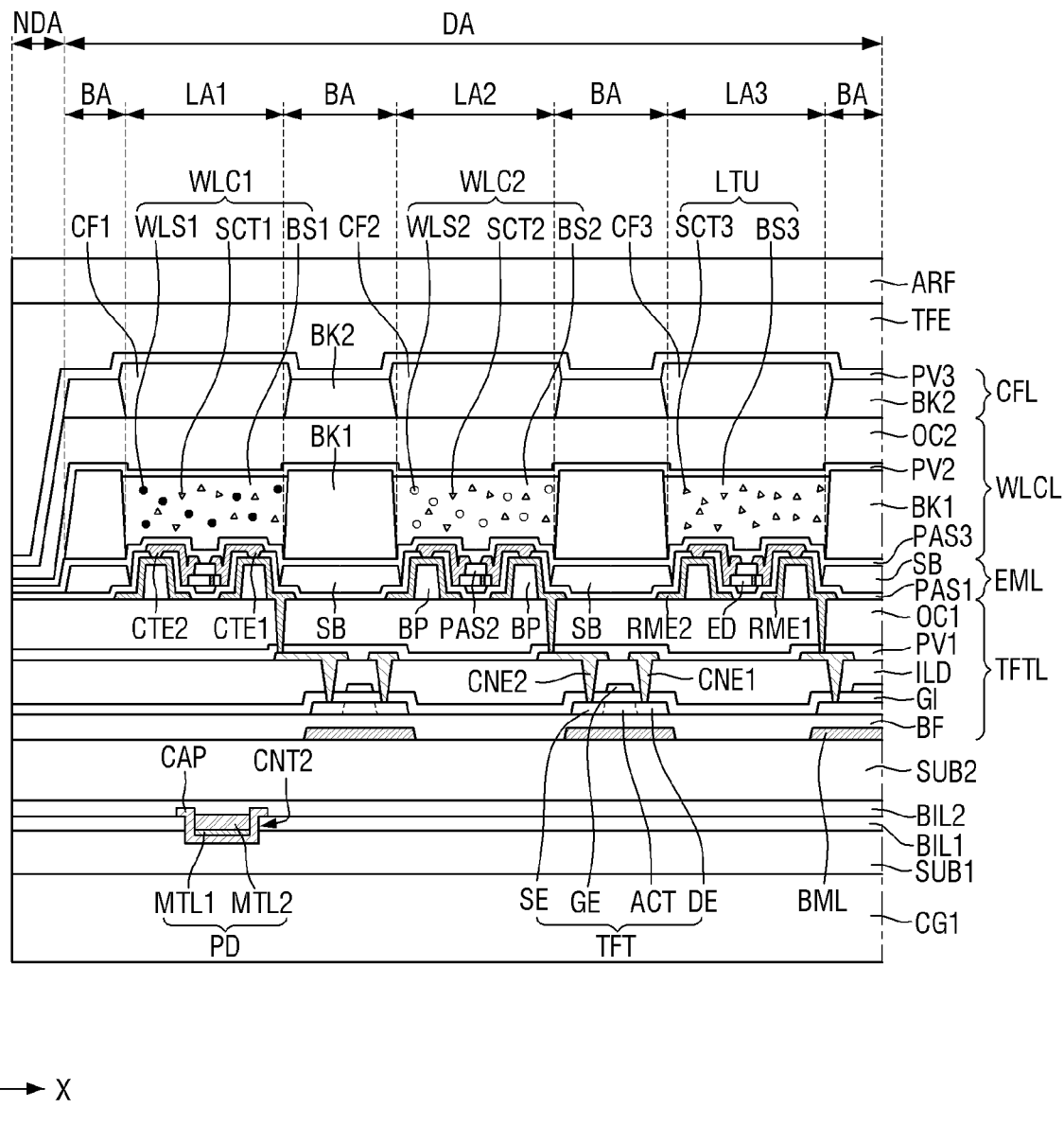

Referring to FIG. 10, the display layer DPL may be formed on the second substrate SUB2. In the display layer DPL, the thin film transistor TFTL, the light emitting element layer EML, the wavelength conversion layer WLCL, and the color filter layer CFL may be sequentially stacked on the second substrate SUB2. The encapsulation layer TFE may be formed to cover the top surface and side surfaces of the display layer DPL, and the anti-reflection film ARF may be formed on the encapsulation layer TFE.

Figure 11:
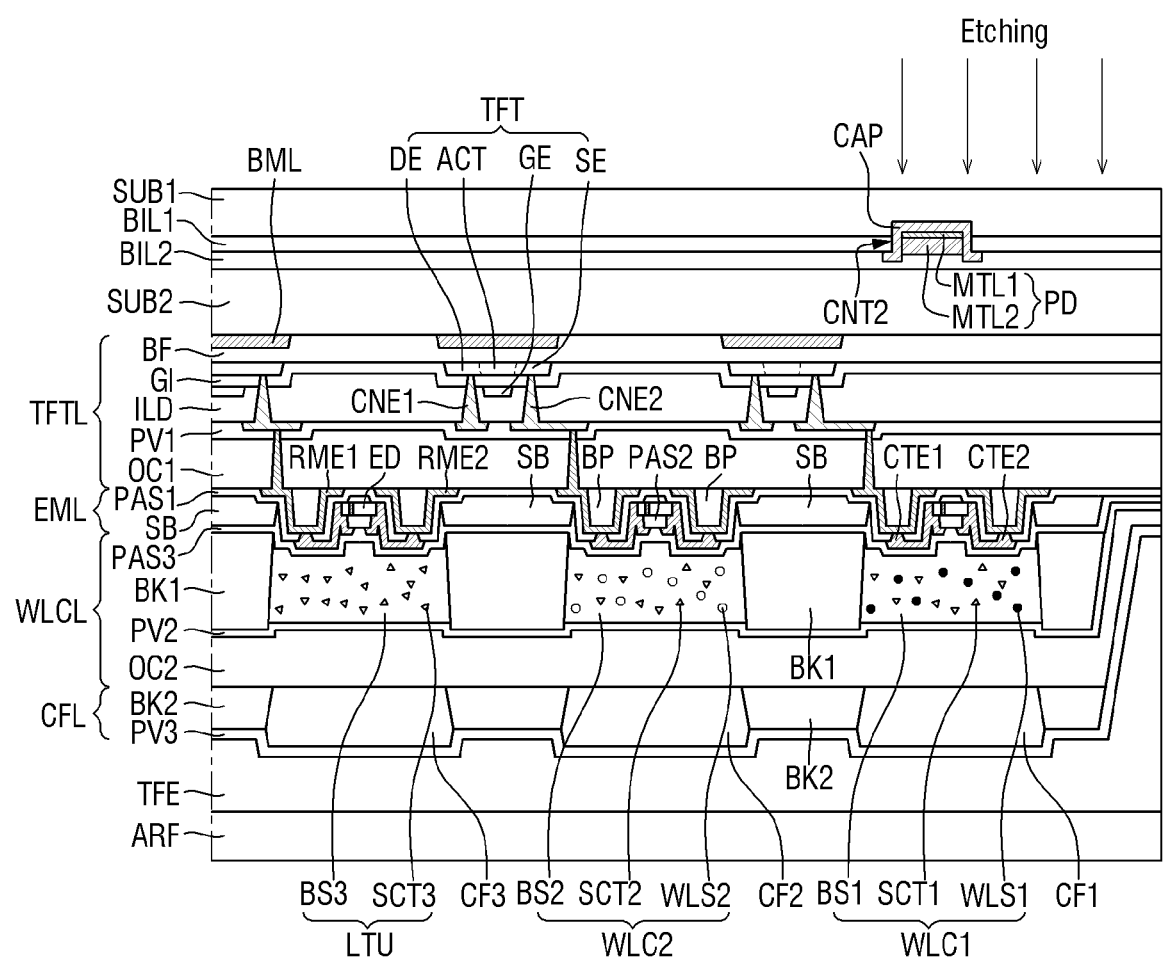
Figure 12:
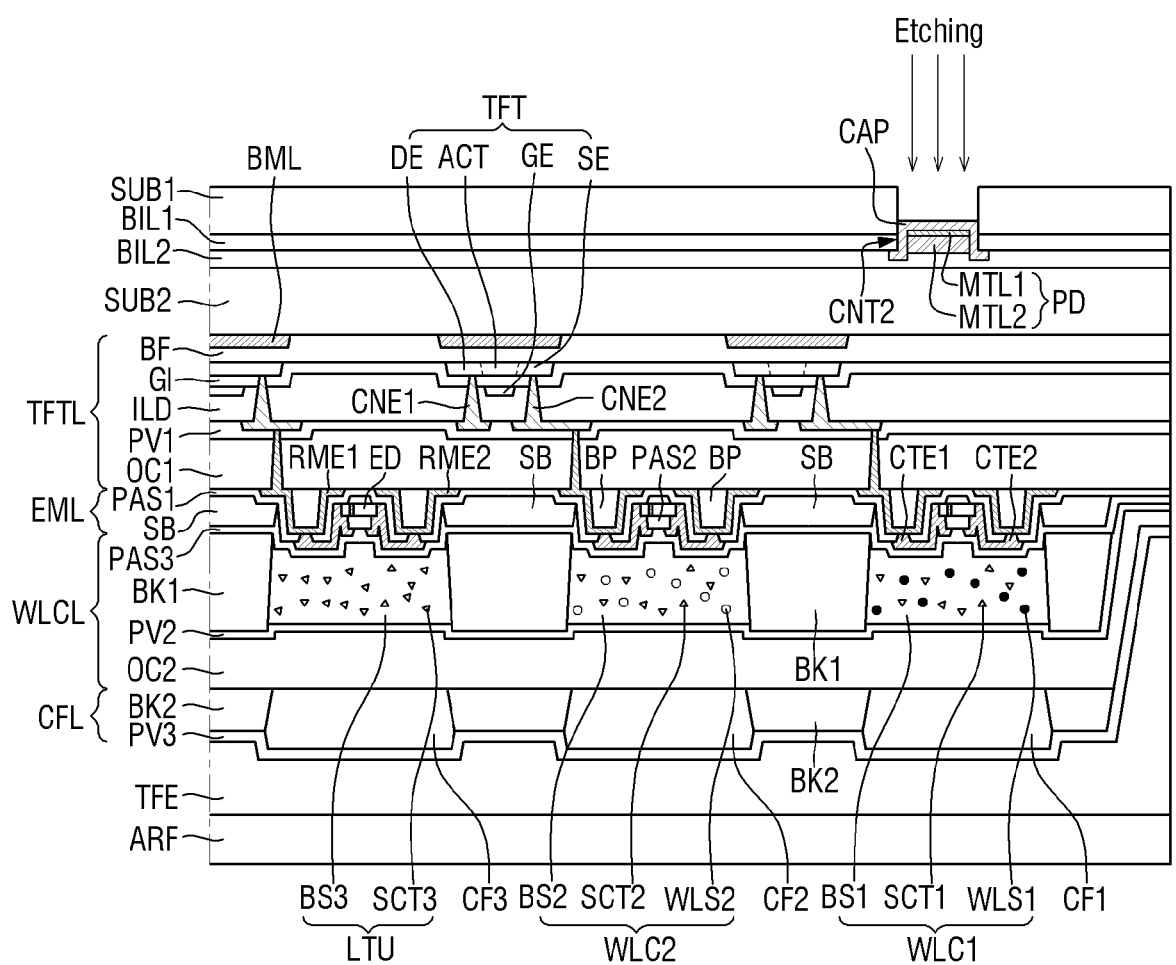

Referring to FIGS. 11 and 12, the display device 10 is vertically inverted to form the flexible film FPCB, and the first carrier substrate CG1 may be removed from the first substrate SUB1. The first carrier substrate CG1 may be removed from the bottom surface of the first substrate SUB1 by using a sacrificial layer (not shown) disposed between the first carrier substrate CG1 and the first substrate SUB1, but the disclosure is not limited thereto. A second carrier substrate CG2 may be formed on a surface of the anti-reflection film ARF. The second carrier substrate CG2 may support the vertically inverted display device 10. For example, the second carrier substrate CG2 may be a glass substrate.

The first contact hole CNT1 may be formed on the first substrate SUB1 by etching a surface of the first substrate SUB1. The first contact hole CNT1 is formed by at least one of a dry etching process, a plasma etching process, and a laser etching process. For example, the first contact hole CNT1 of the first substrate SUB1 may be patterned through a plasma etching process using atmospheric pressure plasma (AP plasma). Thus, the first contact hole CNT1 of the first substrate SUB1 may be formed, and the capping layer CAP may be exposed through the first contact hole CNT1. Although the plasma etching process uses NF3 gas, since the capping layer CAP does not generate a fluorine compound, the capping layer CAP may be not etched, and the pad electrode PD may be protected from the etching process.

Figure 13:
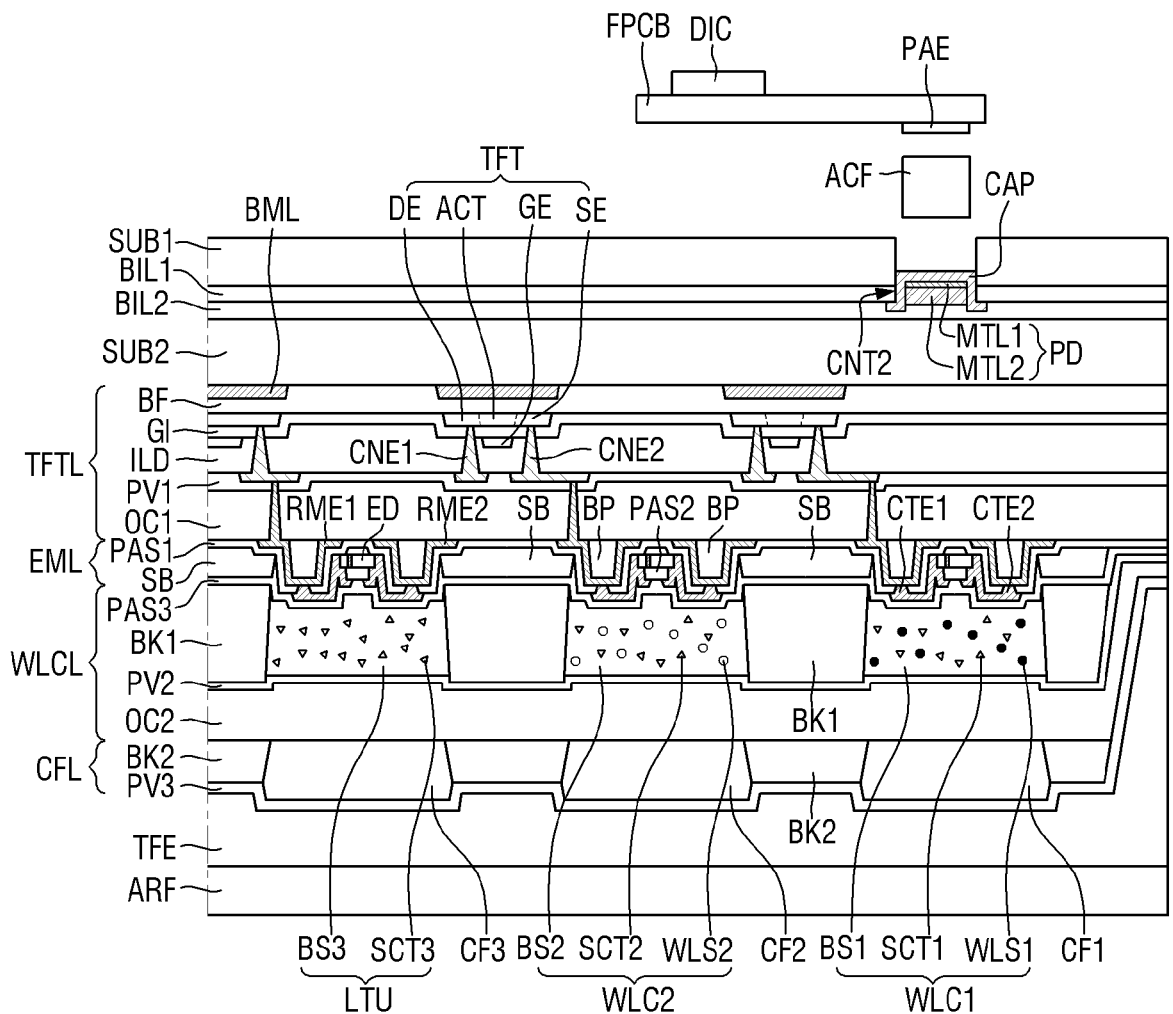
Figure 14:
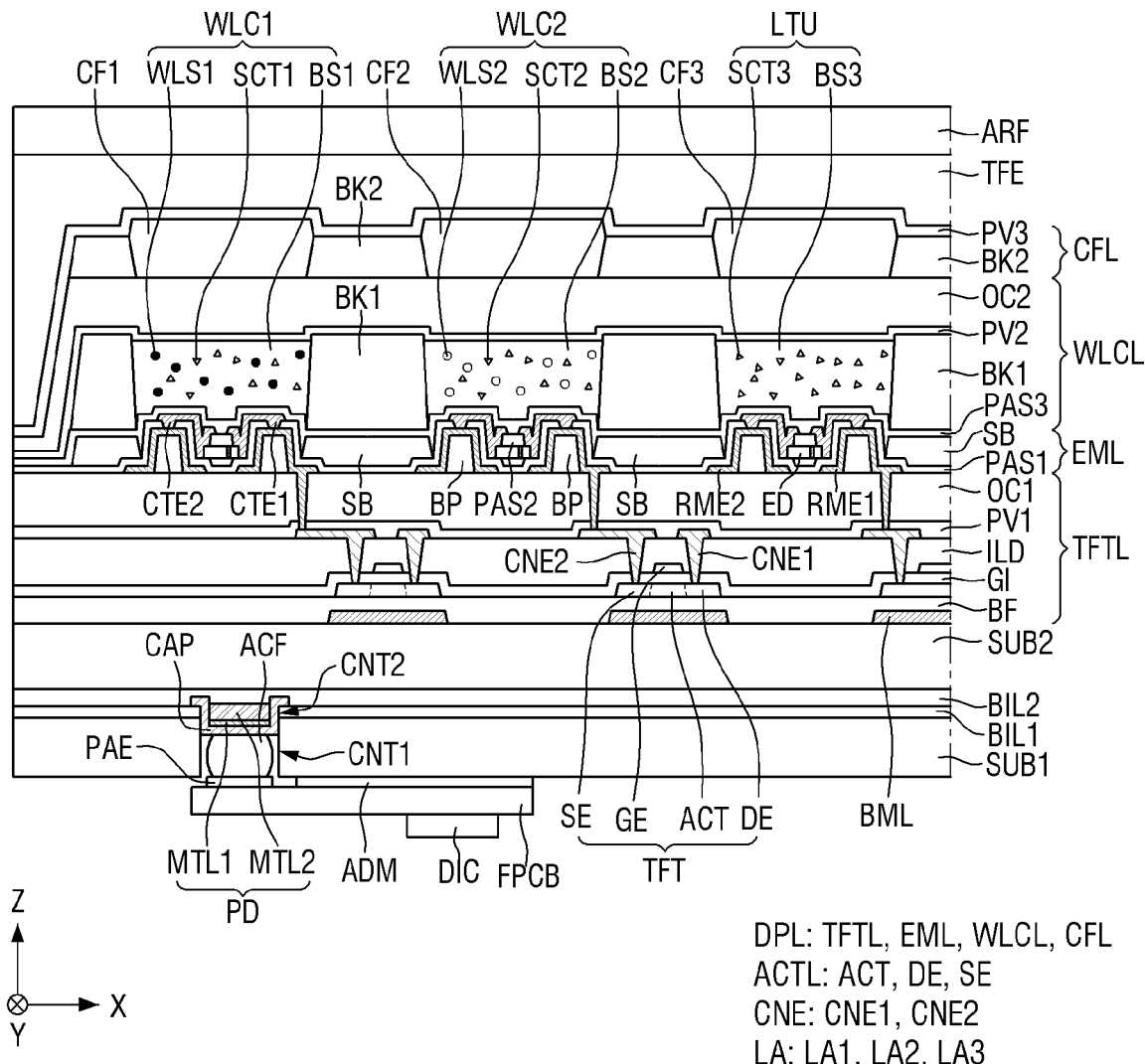

Referring to FIGS. 13 to 14, the flexible film FPCB may be prepared. The display driver DIC may be disposed on a surface of the flexible film FPCB, and the film pad PAE may be disposed on another surface of the flexible film FPCB. The flexible film FPCB may be aligned along a surface of the first substrate SUB1 so that the film pad PAE faces the first substrate SUB1. The film pad PAE of the flexible film FPCB and the capping layer CAP may be electrically connected using the connection film ACF. The film pad PAE of the flexible film FPCB may be electrically connected to the pad electrode PD through the connection film ACF and the capping layer CAP.

The flexible film FPCB may be attached and fixed to a surface of the first substrate SUB1 using the adhesive member ADM. However, the disclosure is not limited thereto, and the adhesive member ADM may be omitted. Thus, the display device 10 according to an embodiment may be manufactured.

Figure 15:
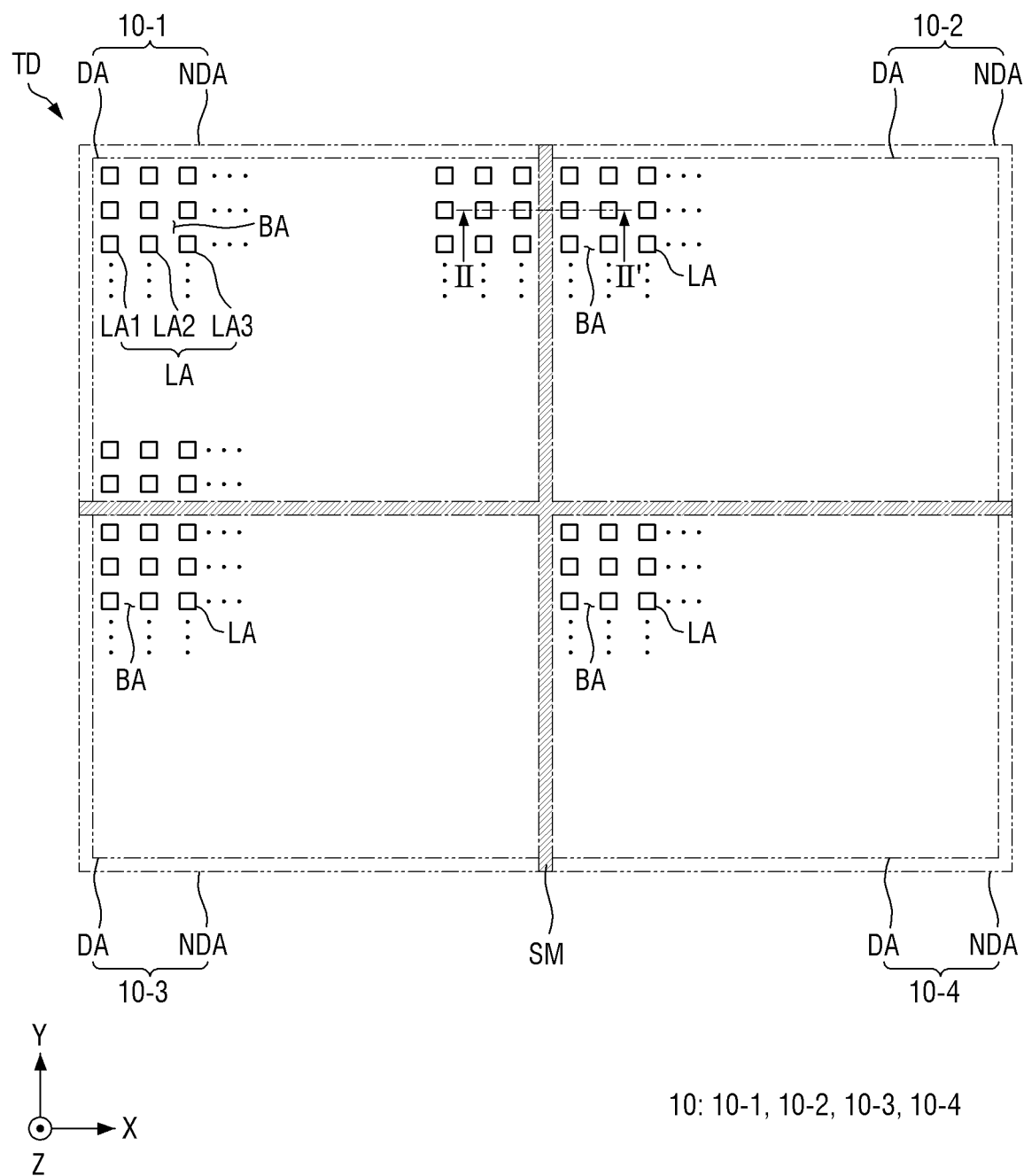
FIG. 15 is a plan view illustrating a bonding structure of a tiled display device according to an embodiment.
Figure 16:
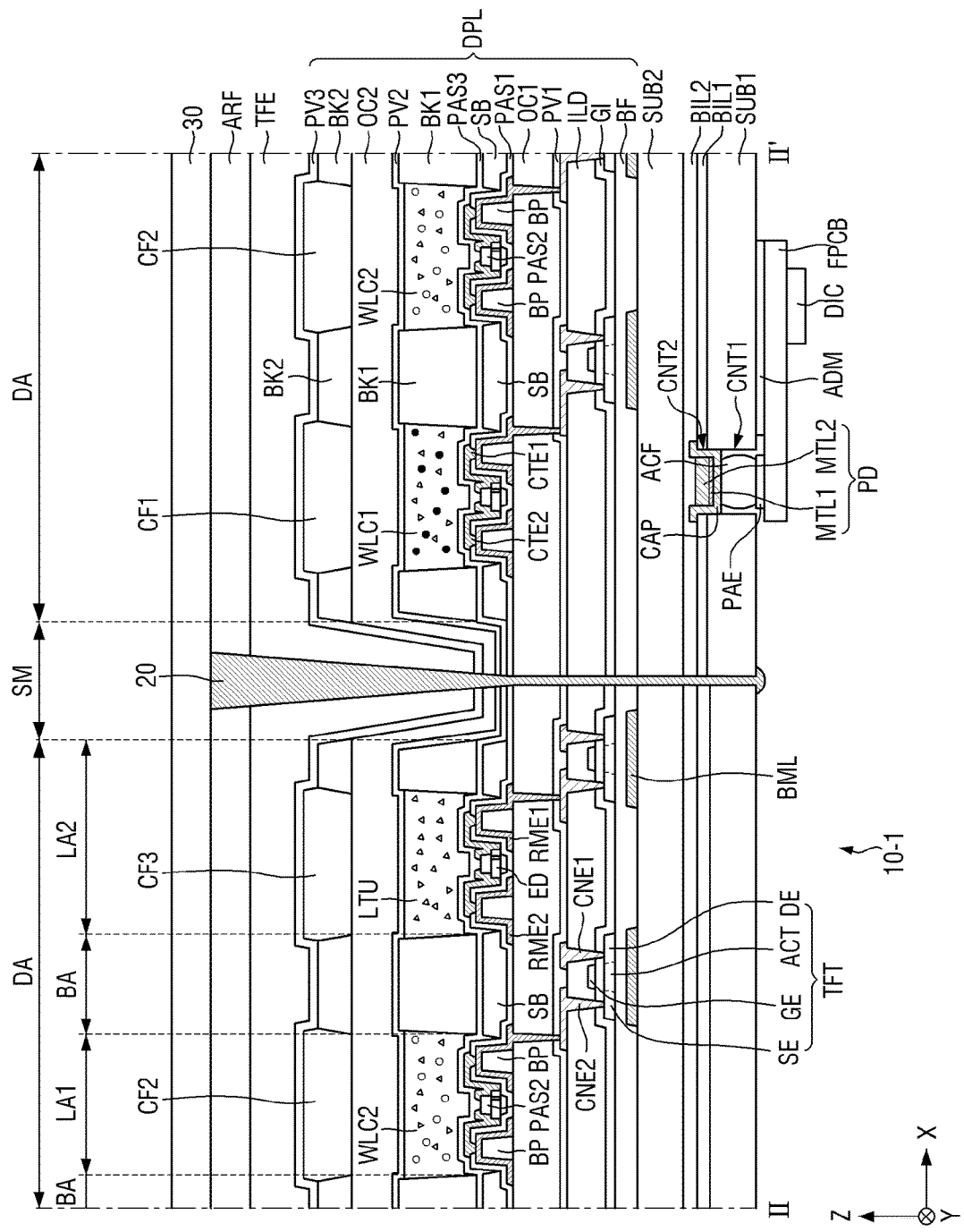
FIG. 16 is a schematic cross-sectional view taken along line II-II' of FIG. 15.

FIG. 15 is a plan view illustrating a bonding structure of a tiled display device according to an embodiment. FIG. 16 is a schematic cross-sectional view taken along line of FIG. 15.

Referring to FIGS. 15 and 16, the tiled display device TD may include multiple display devices 10, a coupling member 20, and a cover member 30. The display devices 10 may be arranged in a grid form, but are not limited thereto. The display devices 10 may be electrically connected in a first direction (X-axis direction) and/or a second direction (Y-axis direction), and the tiled display device TD may have a particular shape. For example, the display devices 10 may have the same size, but are not limited thereto. In another embodiment, the display devices 10 may have different sizes.

The tiled display device TD may include first to fourth display devices 10-1 to 10-4. The number and connection relationship of the display devices 10 are not limited to the embodiment of FIG. 15. The number of the display devices 10 may be determined according to the size of each of the display devices 10 and the tiled display device TD. For example, the tiled display device TD may include a display device 10 illustrated in FIG. 3.

The display device 10 may include a display area DA and a non-display area NDA. The display area DA may include multiple pixels to display an image. The non-display area NDA may be disposed adjacent to the display area DA or surround the display area DA, and may not display an image.

The tiled display device TD may include a coupling area SM disposed between the display areas DA. The tiled display device TD may be formed by connecting non-display areas NDA of each of the adjacent display devices 10. The display devices 10 may be electrically connected to each other by an adhesive member or the coupling member 20 disposed in the coupling area SM. The coupling area SM of each of the display devices 10 may not include a flexible film. Accordingly, the distance between each of the display areas DA of the display devices 10 may be close enough that the coupling area SM between the display devices 10 is not recognized by the user. The reflectance of external light of the display areas DA of each of the display devices 10 may be substantially the same as that of the coupling area SM between the display devices 10. Accordingly, in the tiled display device TD, the coupling area SM between the display devices 10 may be prevented from being recognized by the user, thereby reducing a sense of disconnection between the display devices 10 and improving a sense of immersion in an image.

The display device 10 may include multiple pixels arranged in rows and columns in the display area DA. Each of the pixels may include an emission area LA defined by a pixel defining layer or bank, and may emit light having a peak wavelength through the emission area LA. For example, the display area DA of the display device 10 may include first to third emission areas LA1, LA2, and LA3. Each of the first to third emission areas LA1, LA2, and LA3 may be an area in which light generated from the light emitting element of the display device 10 is emitted to the outside of the display device 10.

The first to third emission areas LA1, LA2, and LA3 may be sequentially arranged repetitively in the first direction (X-axis direction) in the display area DA. For example, the third emission area LA3 may be larger in size than the first emission area LA1, and the first emission area LA1 may be larger in size than the second emission area LA2. In another embodiment, the first emission area LA1, the second emission area LA2, and the third emission area LA3 may be substantially the same in size.

The display area DA of the display device 10 may include a light blocking area BA surrounding the emission areas LA. The light blocking area BA may prevent the colored lights emitted from the first to third emission areas LA1, LA2, and LA3 from mixing with one another.

In the tiled display device TD, side surfaces of adjacent display devices 10 may be connected to each other using the coupling members 20 disposed between the display devices 10. The coupling member 20 may connect the first to fourth display devices 10-1 to 10-4 arranged in a grid shape to each other thereby implementing the tiled display device TD. The coupling member 20 may connect the side surface of the adjacent first substrates SUB1 of the display devices, side surfaces of the first and second barrier insulating layers BIL1 and BIL2, the side surface of the second substrate SUB2, the side surface of the display layer DPL, the side surface of the encapsulation layer TFE, and/or the side surface of the anti-reflection film ARF.

For example, the coupling member 20 may include an adhesive or a double-sided tape having a relatively thin thickness to minimize the gap between the display devices 10. In another embodiment, the coupling member 20 may be formed of a coupling frame having a relatively thin thickness to minimize the gap between the display devices 10. Accordingly, in the tiled display device TD, the coupling area SM between the display devices 10 may be prevented from being recognized by the user.

The cover member 30 may be disposed on the top surface of the display devices 10 and the coupling member 20 to cover the display devices 10 and the coupling member 20. For example, the cover member 30 may be disposed on the top surface of the anti-reflection film ARF of each of the display devices 10. The cover member 30 may protect the top surface of the tiled display device TD.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device comprising:
a first substrate comprising a first contact hole;
a first barrier insulating layer disposed on the first substrate and comprising a second contact hole overlapping the first contact hole in a thickness direction;
a capping layer disposed on the first barrier insulating layer, at least a portion of the capping layer being disposed in the second contact hole and the first contact hole;
a pad electrode disposed on the capping layer;
a display layer disposed on the pad electrode; and
a flexible film disposed under the first substrate and electrically connected to the pad electrode through the first contact hole and the second contact hole,
wherein, the capping layer comprises a groove formed by a step between a portion disposed on the first barrier insulating layer and a portion disposed in the first contact hole and the second contact hole, and
the pad electrode is disposed in the groove.

2. The display device of claim 1, wherein
the first contact hole is a through hole penetrating the first substrate, and
the second contact hole is a through hole penetrating the first barrier insulating layer.

3. The display device of claim 1, wherein
the capping layer is exposed to an outside area through the first contact hole, and
the capping layer surrounds the pad electrode.

4. The display device of claim 1, wherein a bottom surface of the capping layer is disposed lower than a top surface of the first substrate.

5. The display device of claim 1, wherein the capping layer includes at least one of ITO, IZO, and IGZO.

6. The display device of claim 1, wherein the pad electrode comprises:

a first metal layer disposed on the capping layer; and
a second metal layer disposed on the first metal layer.

7. The display device of claim 6, wherein a top surface of the first metal layer is disposed lower than a top surface of the first substrate.

8. The display device of claim 6, wherein
a bottom surface of the second metal layer is disposed lower than a top surface of the first substrate, and
a top surface of the second metal layer is disposed higher than the top surface of the first substrate.

9. The display device of claim 1, further comprising:
a second substrate; and
a second barrier insulating layer disposed between the pad electrode and the display layer, wherein
the second barrier insulating layer covers the pad electrode and the capping layer, and
the second substrate is disposed on the second barrier insulating layer.

10. The display device of claim 1, further comprising:
a connection film disposed between the flexible film and the pad electrode, wherein
the connection film electrically connects the pad electrode to the flexible film.

11. The display device of claim 10, wherein
the flexible film comprises a film pad disposed on a surface facing the first substrate, and
the connection film electrically contacts each of the film pad and the capping layer.

12. The display device of claim 1, wherein the display layer comprises:
a thin film transistor layer disposed on the pad electrode;
a light-emitting element layer disposed on the thin film transistor layer;
a wavelength conversion layer disposed on the light-emitting element layer; and
a color filter layer disposed on the wavelength conversion layer.

13. A tiled display device comprising;
a plurality of display devices; and
a bonding member connecting the plurality of display devices, wherein
each of the plurality of display devices comprises:
a display area comprising a plurality of pixels;
a non-display area disposed adjacent to the display area;
a first substrate comprising a first contact hole;
a first barrier insulating layer disposed on the first substrate and comprising a second contact hole overlapping the first contact hole in a thickness direction;
a capping layer disposed on the first barrier insulating layer, at least a portion of the capping layer being disposed in the second contact hole and the first contact hole;
a pad electrode disposed on the capping layer;
a display layer disposed on the pad electrode; and
a flexible film disposed under the first substrate and electrically connected to the pad electrode through the first contact hole and the second contact hole,
wherein, the capping layer comprises a groove formed by a step between a portion disposed on the first barrier insulating layer and a portion disposed in the first contact hole and the second contact hole, and
the pad electrode is disposed in the groove.

* * * * *